US012795998B2

(12) United States Patent
Lin

(10) Patent No.: US 12,795,998 B2
(45) Date of Patent: Nov. 10, 2026

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventor: Ta-Chun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 442 days.

(21) Appl. No.: 18/467,650

(22) Filed: Sep. 14, 2023

(65) Prior Publication Data

US 2025/0098216 A1 Mar. 20, 2025

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |

(52) U.S. Cl.

CPC ....... *H10D 30/6729* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/038* (2025.01); *H10D 84/85* (2025.01)

(58) Field of Classification Search

None

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |

(Continued)

*Primary Examiner* — Samuel Park

(74) *Attorney, Agent, or Firm* — Maschoff Brennan

(57) ABSTRACT

A semiconductor device includes a first channel region, a second channel region, a gate structure, a first source/drain epitaxial structure, a second source/drain epitaxial structure, a contact etch stop layer, and an interlayer dielectric layer. The gate structure is across the first channel region and the second channel region. The first source/drain epitaxial structure is on a side of the first channel region. The second source/drain epitaxial structure is on a side of the second channel region. The contact etch stop layer surrounds the first source/drain epitaxial structure and the second source/drain epitaxial structure. A first portion of the contact etch stop layer over the first source/drain epitaxial structure is thicker than a second portion of the contact etch stop layer over the second source/drain epitaxial structure. The interlayer dielectric layer is over the contact etch stop layer.

20 Claims, 51 Drawing Sheets

(56) References Cited

U.S. PATENT DOCUMENTS

| | | | | |
|---|---|---|---|---|
| 9,608,116 | B2 | 3/2017 | Ching et al. | |
| 2016/0099342 | A1* | 4/2016 | Basker | H10D 84/853 438/283 |
| 2020/0052091 | A1* | 2/2020 | Cheng | H10D 30/62 |
| 2021/0343600 | A1* | 11/2021 | Chen | H10D 64/017 |

* cited by examiner

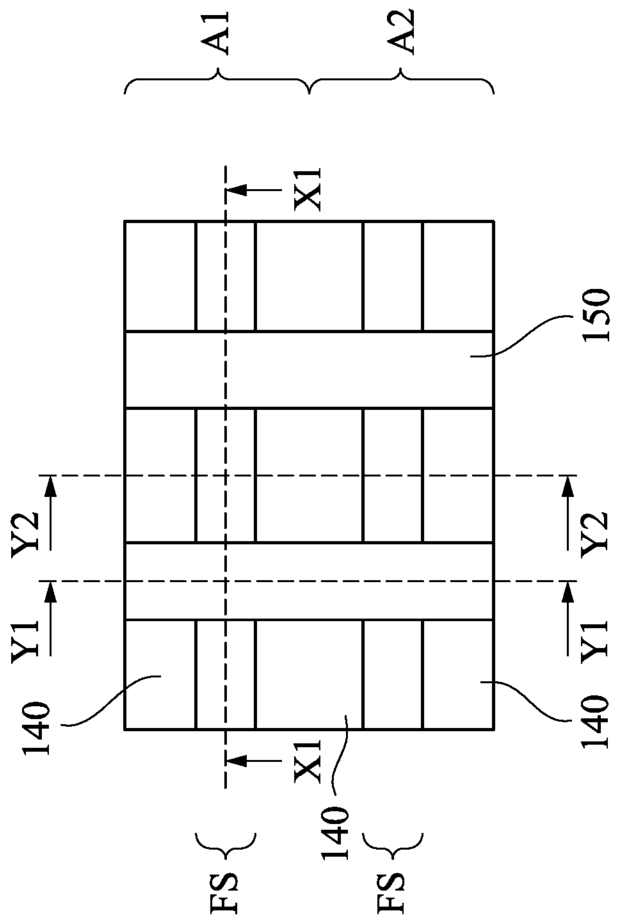
Fig. 5A
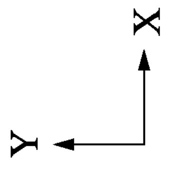

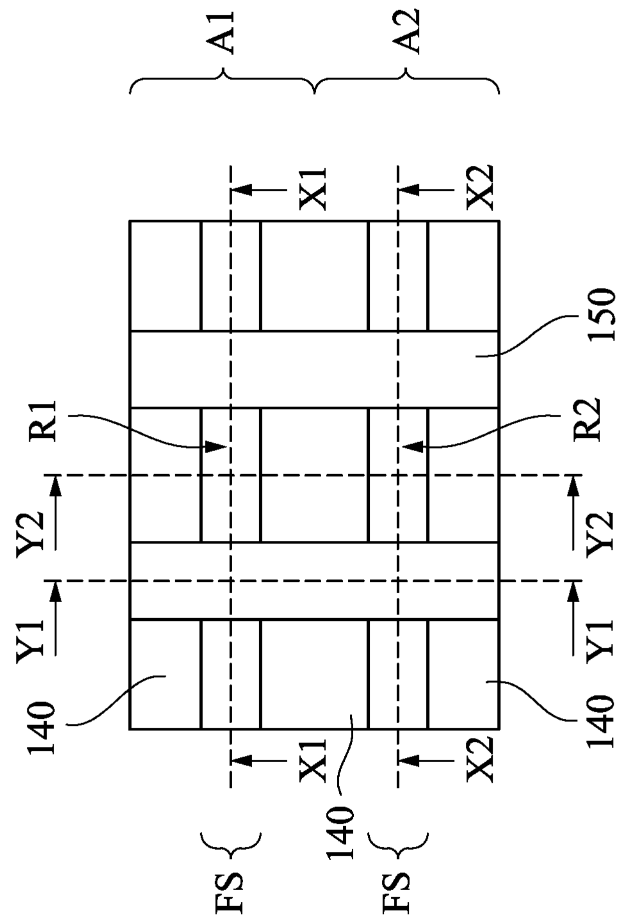
Fig. 6A
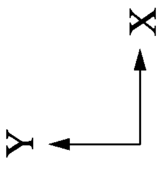

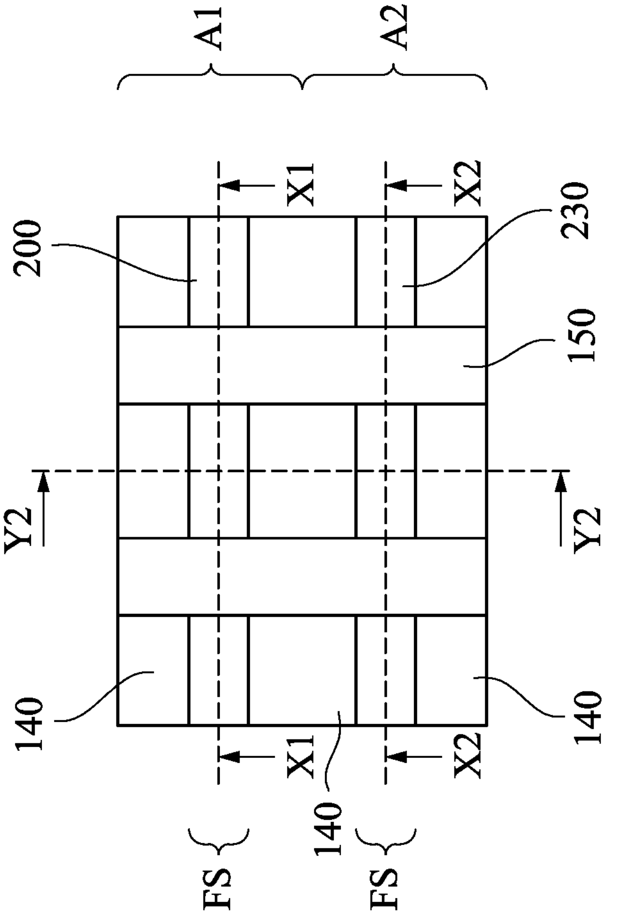
Fig. 13A
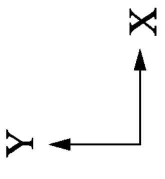

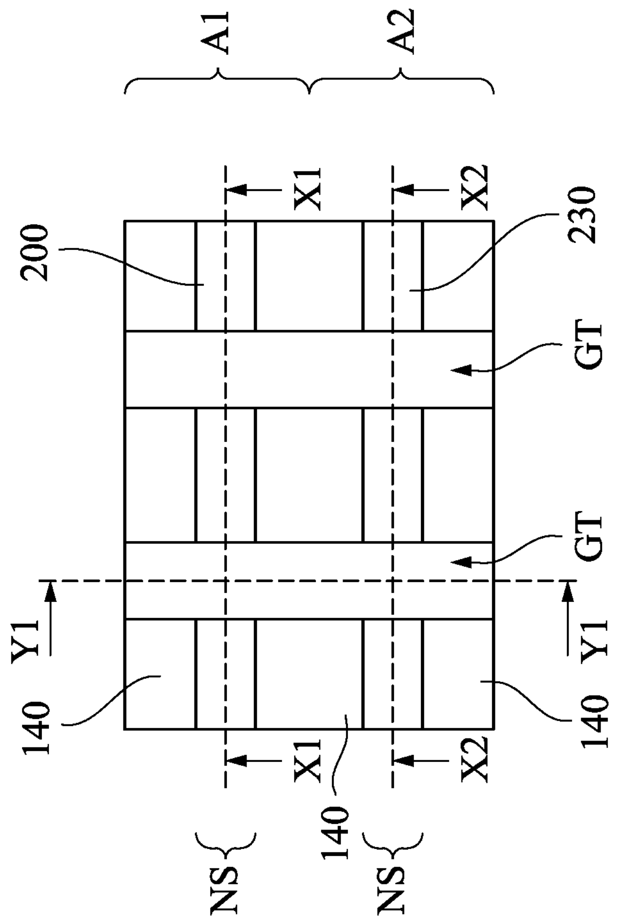
Fig. 15A
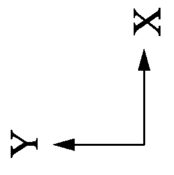

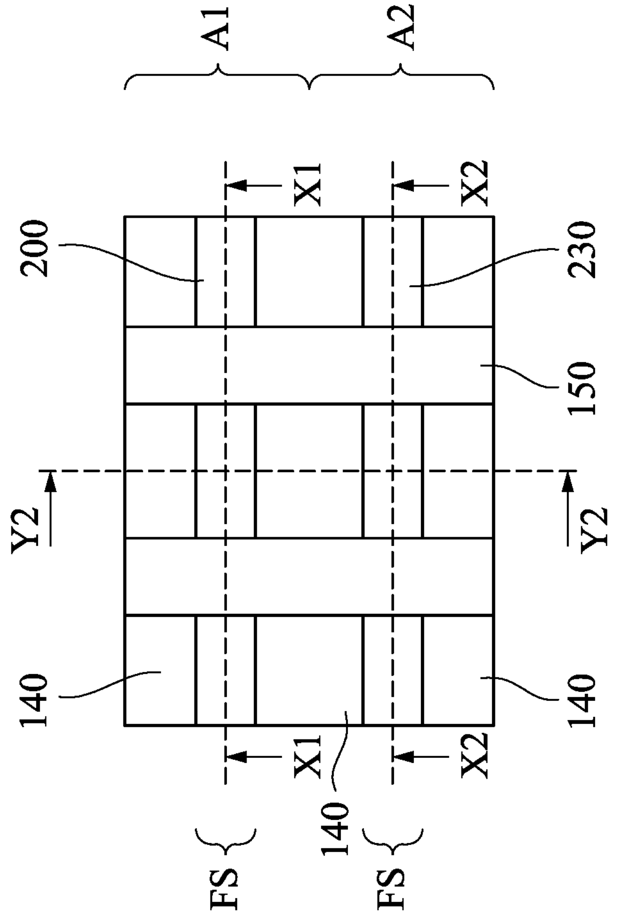
Fig. 22A
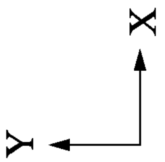

SEMICONDUCTOR DEVICE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
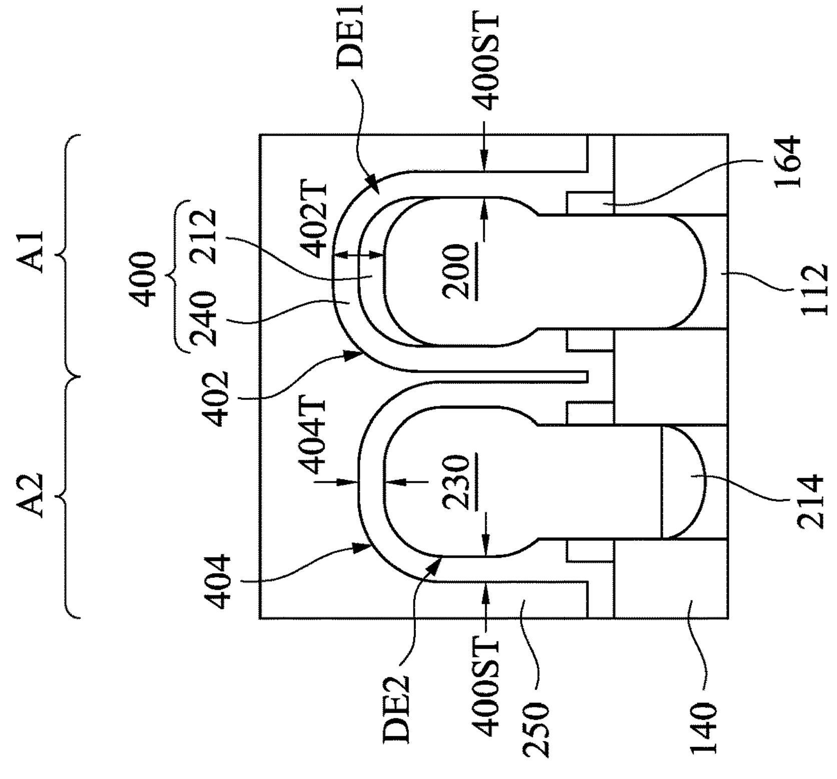
FIGS. 1A and 1B illustrate cross-sectional views of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "multi-gate device" is used to describe a device (e.g., a semiconductor transistor) that has at least some gate material disposed on multiple sides of at least one channel of the device. In some examples, the multi-gate device may be referred to as a gate all around (GAA) device or a nanosheet device having gate material disposed on at least four sides of at least one channel of the device. The channel region may be referred to as a "nanowire," which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

Figure 1B:
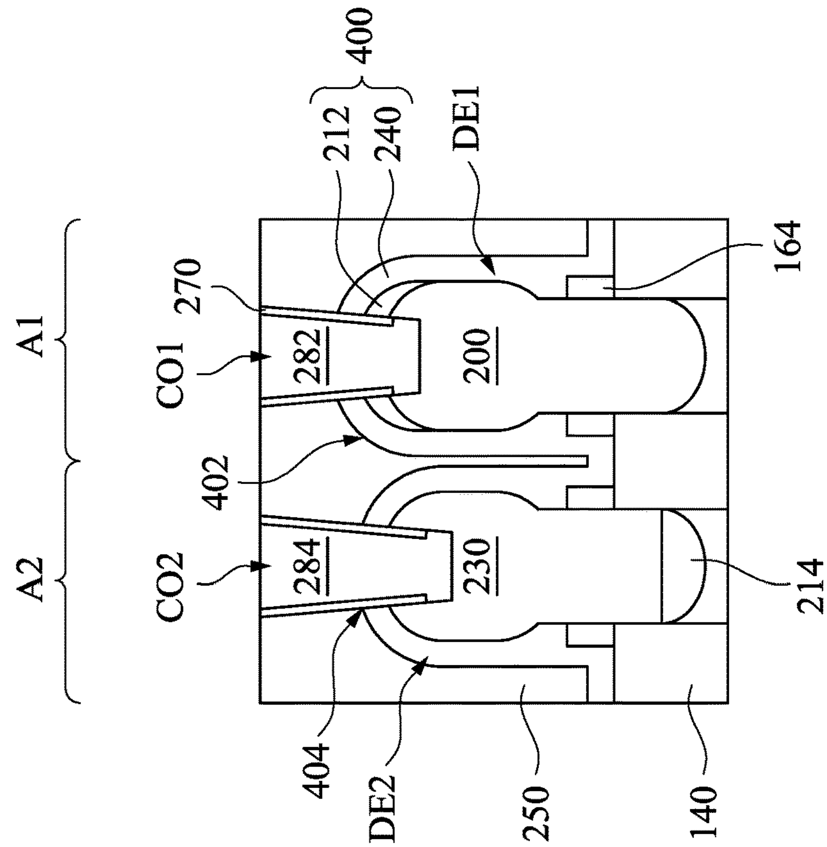

FIGS. 1A and 1B illustrate cross-sectional views of a semiconductor device in accordance with some embodiments of the present disclosure. The semiconductor device includes a first region A1 wherein a first transistor DE1 is located and a second region A2 wherein a second transistor DE2 is located. The transistors DE1 and DE2 can be planar transistors, FinFET, or GAA transistors. The first transistor DE1 includes a first source/drain epitaxial structure 200 formed over a substrate portion 112. The second transistor DE2 includes a second source/drain epitaxial structure 230 formed over a substrate portion 112. The first source/drain epitaxial structure 200 and the second source/drain epitaxial structure 230 are of opposite conductivity types. In some embodiments of the present disclosure, the first transistor DE1 is a p-type device, and the first source/drain epitaxial structure 200 is of p-type, while the second transistor DE2 is an n-type device, and the second source/drain epitaxial structure 230 is of n-type. In some alternative embodiments, the first transistor DE1 is a n-type device, and the first source/drain epitaxial structure 200 is of n-type, while the second transistor DE2 is a p-type device, and the second source/drain epitaxial structure 230 is of p-type. An inter-layer dielectric (ILD) layer 250 surrounds the first source/drain epitaxial structure 200 and the second source/drain epitaxial structure 230, and a contact etch stop layer (CESL) 400 spaces the ILD layer 250 from the first source/drain epitaxial structure 200 and the second source/drain epitaxial structure 230.

In some embodiments of the present disclosure, a top thickness 402T of a first portion 402 of the CESL 400 over the first source/drain epitaxial structure 200 is greater than a top thickness 404T of a second portion 404 of the CESL 400 over the second source/drain epitaxial structure 230. A difference between the top thickness 402T and the top thickness 404T may be in a range from about 1 nanometer to about 10 nanometers for contact opening etching depth modulation. If the difference between the top thickness 402T and the top thickness 404T is less than about 1 nanometer, the subsequent contact openings may not be etched with depth modulation for device optimization. If the difference between the top thickness 402T and the top thickness 404T is greater than about 10 nanometers, it may be difficult to etching the contact openings.

In FIG. 1B, source/drain openings CO1 and CO2 are etched in the ILD layer 250 and the CESL 400 by same etch processes. Due to the thickness difference between the first and second portions 402 and 404 of the CESL 400, the source/drain opening CO2 over the second source/drain epitaxial structure 230 is deeper than the source/drain opening CO1 over the first source/drain epitaxial structure 200. Dielectric liners 270 are formed in the source/drain openings CO1 and CO2 for electrical isolation. The source/drain contact 282 formed in the source/drain opening CO1 and contacting the first source/drain epitaxial structure 200, while the source/drain contact 284 is formed in the source/drain opening CO2 and contacting the second source/drain epitaxial structure 230. In some embodiments where the source/drain epitaxial structure 200 and 230 are respectively of p-type and n-type, due to the depth difference between the source/drain openings CO1 and CO2, the p-type source/drain epitaxial structure 200 with the shallower source/drain contact 282 thereon can maintain channel stress, thereby lowering channel resistance. Also, in some embodiments where the source/drain epitaxial structure 200 and 230 are respectively of p-type and n-type, due to the depth difference between the source/drain openings CO1 and CO2, the contact area between the source/drain contact 284 and the n-type source/drain epitaxial structure 230 is greater than the contact area between the source/drain contact 282 and the p-type source/drain epitaxial structure 200, thereby lowering the parasitic resistance.

In some embodiments, the CESL 400 includes a conformal layer 240 and a regional layer 212. In some embodiments, the conformal layer 240 and the regional layer 212 may include same or different dielectric materials, such as $SiO_2$, SiN, SiCN, SiCON, SiCO, AlO, HfO, other high-k dielectric material (k>=7), the like, or the combination thereof. In some embodiments, the conformal layer 240 includes SiCON and SiN, the regional layer 212 includes SiN, and thus an oxygen concentration of the conformal layer 240 is greater than that of the regional layer 212. The conformal layer 240 may have a substantially same thickness of the first source/drain epitaxial structure 200 and the second source/drain epitaxial structure 230. The regional layer 212 is formed over the first source/drain epitaxial structure 200, not over the second source/drain epitaxial structure 230. The configuration of the conformal layer 240 and the regional layer 212 results the thickness difference in the CESL 400.

Within the composite CESL 400, the number of dielectric layers at tops of the first source/drain epitaxial structure 200 may be greater than that of the number of dielectric layers at sides of the first source/drain epitaxial structure 200. In some embodiments, portions of the CESL 400 at lateral side walls of the source/drain epitaxial structure 200 and 230 may have a thickness 400ST less than the top thickness 402T of a first portion 402 of the CESL 400. A difference between the thickness 400ST and the top thickness 402T may be in a range from about 1 nanometer to about 10 nanometers for contact opening etching depth modulation. If the difference between the thickness 400ST and the top thickness 402T is less than about 1 nanometer, the subsequent contact openings may not be etched with depth modulation for device optimization. If the difference between the thickness 400ST and the top thickness 402T is greater than about 10 nanometers, it may be difficult to etching the contact openings. In some alternative embodiments, the top thickness 402T of the first portion 402 of the CESL 400 over the first source/drain epitaxial structure 200 may be substantially equal to the top thickness 404T of the second portion 404 of the CESL 400 over the second source/drain epitaxial structure 230, and the thickness 400ST of the portions of the CESL 400 at lateral sidewalls of the source/drain epitaxial structure 200 and 230 may be less than the top thickness 402T and the top thickness 404T.

In some embodiments of the present disclosure, an isolation layer 214 is formed between the second source/drain epitaxial structure 230 and the substrate portion 112. The isolation layer 214 may include a same material as that of the regional layer 212. The isolation layer 214 electrically isolated the second source/drain epitaxial structure 230 from the underlying substrate portion 112, thereby preventing current leakage.

FIGS. 2-19C illustrate top and cross-sectional views of intermediate stages in the manufacture of a semiconductor device in accordance with some embodiments of the present disclosure. FIGS. 3A, 4A, 5A, 6A, 13A, 15A, and 16A are top views of the semiconductor device at various manufacturing stages in accordance with some embodiments. FIGS. 2, 3B, 4B, 5B, 6B, 15B, and 16B, are cross-sectional views of the semiconductor device (e.g., taken along line Y1-Y1 in FIGS. 3A, 4A, 5A, 6A, 15A, and 16A) at various manufacturing stages in accordance with some embodiments. FIGS. 5C, 6C, 7A, 8, 9A, 10-12, 13B, 14A, 17, 18, and 19A, are cross-sectional views of the semiconductor device (e.g., taken along line Y2-Y2 in FIGS. 5A, 6A, and 13A) at various manufacturing stages in accordance with some embodiments. FIGS. 5D, 6D, 7B, 9B, 13C, 14B, 15C, 16C, and 19B are cross-sectional views of the semiconductor device (e.g., taken along line X1-X1 in FIGS. 5A, 6A, 13A, 15A, and 16A) at various manufacturing stages in accordance with some embodiments. FIGS. 6E, 7C, 9C, 13D, 14C, 15D, 16D, and 19C are cross-sectional views of the semiconductor device (e.g., taken along line X2-X2 in FIGS. 6A, 9B, 13A, 15A, and 16A) at various manufacturing stages in accordance with some embodiments. The illustrated process in FIGS. 2-19C may be applicable to manufacture the semiconductor device in FIGS. 1A and 1B. It is understood that additional steps may be provided before, during, and after the steps shown in FIGS. 2-19C, and some of the steps described below can be replaced or eliminated for additional embodiments of the method. The order of the operations/processes may be interchangeable.

Figure 2:
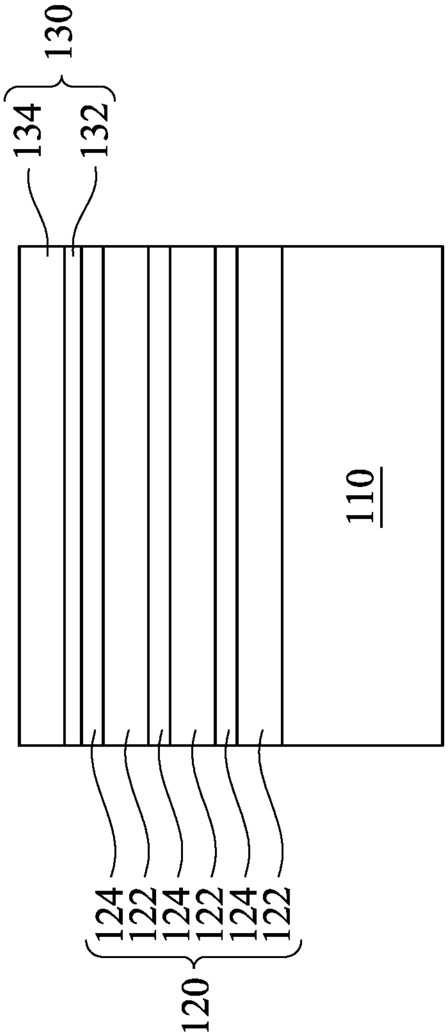
FIGS. 2-19C illustrate top and cross-sectional views of intermediate stages in the manufacture of a semiconductor device in accordance with some embodiments of the present disclosure.

Reference is made to FIG. 2. An epitaxial stack 120 is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 120 includes sacrificial layers 122 interposed by channel layers 124. The sacrificial layers 122 and the channel layers 124 may have different semiconductor compositions from each other. In some embodiments, the sacrificial layers 122 and the channel layers 124 may include SiGe with different semiconductor compositions. For example, a Si concentration in the sacrificial layers 122 is less than a Si concentration in the channel layers 124. Stated differently, in the embodiments, a Ge concentration in the sacrificial layers 122 is greater than a Ge concentration in the channel layers 124. For example, the sacrificial layers 122 are $Si_xGe_{1-x}$, and the channel layers 124 are $Si_yGe_{1-y}$, in which x and y are in a range from 0 to 1, and y>x. However, other embodiments are possible including those that provide for the material/compositions having different oxidation rates and/or etch selectivity. In some embodiments where the sacrificial layers 122 include SiGe and the channel layers 124 include Si, the Si oxidation rate of the channel layers 124 is less than the SiGe oxidation rate of the sacrificial layers 122.

The channel layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel layers 124 may be referred to as semiconductor channels in the context. The use of the channel layers 124 to define a channel or channels of a device is further discussed below.

In the present embodiments, three layers of the sacrificial layers 122 and three layers of the channel layers 124 are alternately arranged as illustrated in FIG. 2. It can be appreciated that any number of epitaxial layers can be formed in the epitaxial stack 120; the number of layers depending on the desired number of channels regions for the transistor. In some embodiments, the number of channel layers 124 is between 1 and 10. The sacrificial layers 122 in channel regions(s) may eventually be removed and serve to define a vertical distance between adjacent channel region(s) for a subsequently-formed multi-gate device. In the present embodiments, the sacrificial layer 122 may have a thickness greater than that of the channel layers 124. In some other embodiments, the sacrificial layer 122 may have a thickness equal to or less than that of the channel layers 124.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the channel layers 124 include suitable semiconductor material, such as like Si, Ge, Sn, SiGe, GeSn, III-V semiconductor, the like, or the combination thereof. In some embodiments, the channel layers 124 may include a same semiconductor material as that substrate 110. In some embodiments, the epitaxially grown sacrificial layers 122 include a different material than the substrate 110. For example, the sacrificial layers 122 include suitable semiconductor material, such as Si, Ge, SiGe, GeSn, III-V semiconductor, the like, or the combination thereof. In some other embodiments, at least one of the layers 122 and 124 may include other materials such as a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. As discussed, the materials of the layers 122 and 124 may be chosen based on providing differing oxidation and/or etching selectivity properties. In some embodiments, the layers 122 and 124 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Figure 3A:
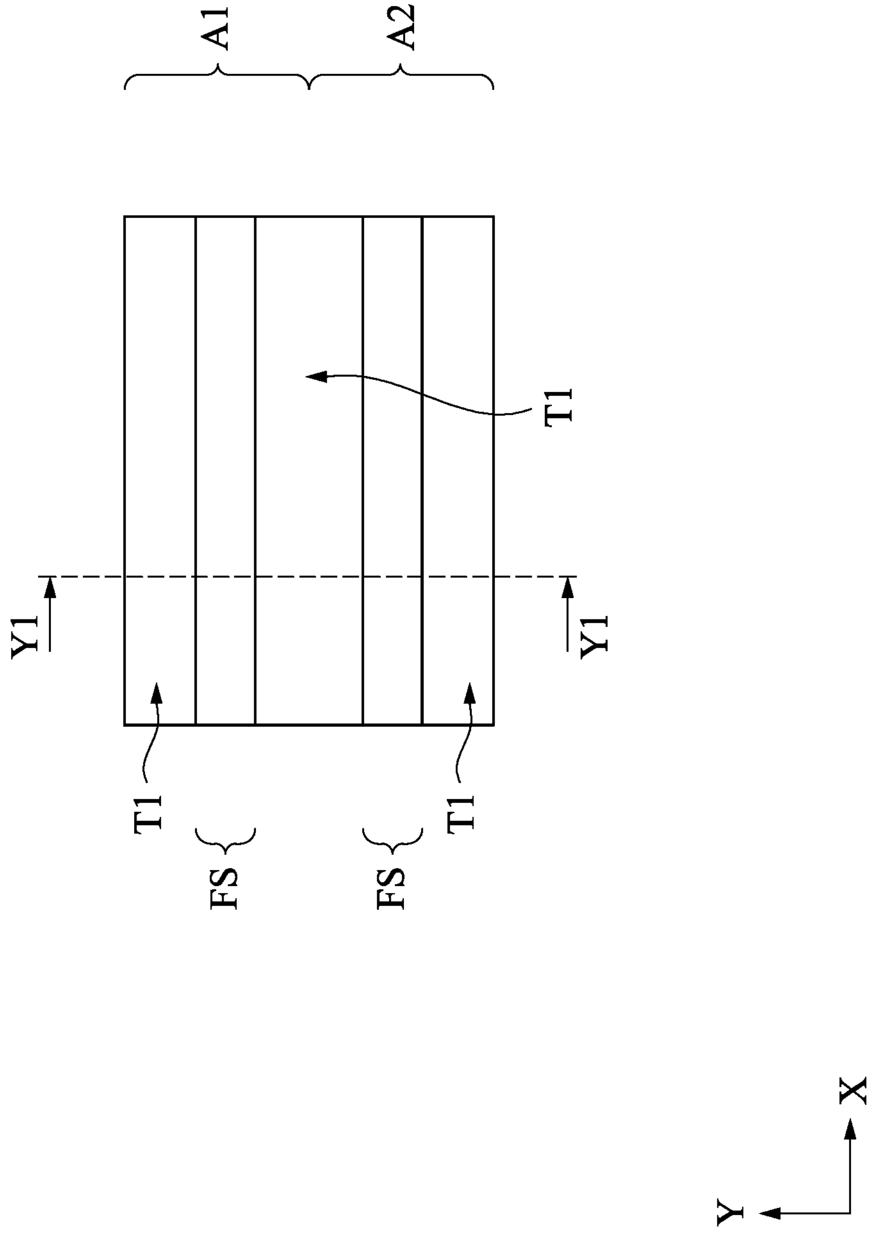
Figure 3B:
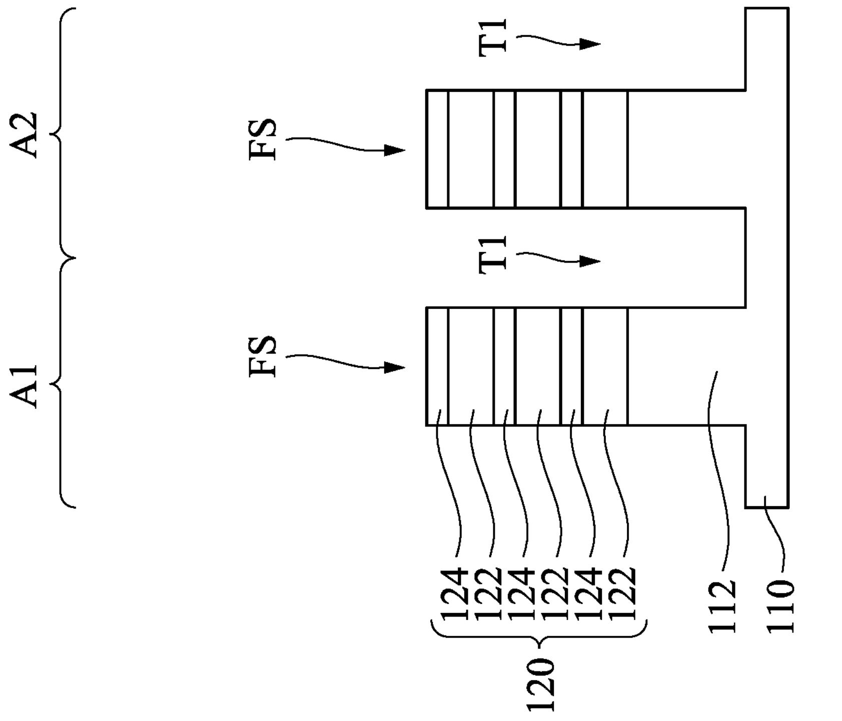

Reference is made to FIGS. 3A and 3B. A plurality of semiconductor fins FS extending from the substrate 110 are formed. The semiconductor fins FS may extend substantially along a same direction X. In various embodiments, each of the fins FS includes a substrate portion 112 formed from the substrate 110 and portions of each of the epitaxial layers of the epitaxial stack 120 including epitaxial layers 122 and 124. The fins FS may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS by etching initial epitaxial stack 120. The etching process can include dry etching, wet etching, reactive ion etching (RIE), and/or other suitable processes.

In the embodiments as illustrated in FIG. 2, a hard mask (HM) layer 130 is formed over the epitaxial stack 120 prior to patterning the fins FS. In some embodiments, the HM layer 130 includes an oxide layer 132 (e.g., a pad oxide layer that may include $SiO_2$) and a nitride layer 134 (e.g., a pad nitride layer that may include $Si_3N_4$) formed over the oxide layer 132. The oxide layer 132 may act as an adhesion layer between the epitaxial stack 120 and the nitride layer 134 and may act as an etch stop layer for etching the nitride layer 134. In some examples, the HM oxide layer 132 includes thermally grown oxide, chemical vapor deposition (CVD)-deposited oxide, and/or atomic layer deposition (ALD)-deposited oxide. In some embodiments, the HM nitride layer 134 is deposited on the HM oxide layer 132 by CVD and/or other suitable techniques.

The fins FS may subsequently be fabricated using suitable processes including photolithography and etch processes. The photolithography process may include forming a photoresist layer (not shown) over the HM layer 130, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process. The patterned mask may then be used to protect regions of the substrate 110, and layers formed thereupon, while an etch process forms trenches T1 in unprotected regions through the HM layer 130, through the epitaxial stack 120, and into the substrate 110, thereby leaving the plurality of extending fins FS. The trenches T1 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins FS. The HM layer 130 may be removed from the fins FS by suitable process after the fin patterning process.

The substrate 110 may include a first region A1 and a second region A2, and the fins FS are formed in the n-type region A2 and the p-type region A1. In some embodiments, a p-type device is to be formed in the first region A1, an n-type device is to be formed in the second region A2. In such embodiments, a p-type well may be formed in the second region A2, and/or a n-type well may be formed in the first region A2. In some alternative embodiments, a n-type device is to be formed in the first region A1, a p-type device is to be formed in the second region A2. In such embodiments, a n-type well may be formed in the second region A2, and/or a p-type well may be formed in the first region A2.

Figure 4A:
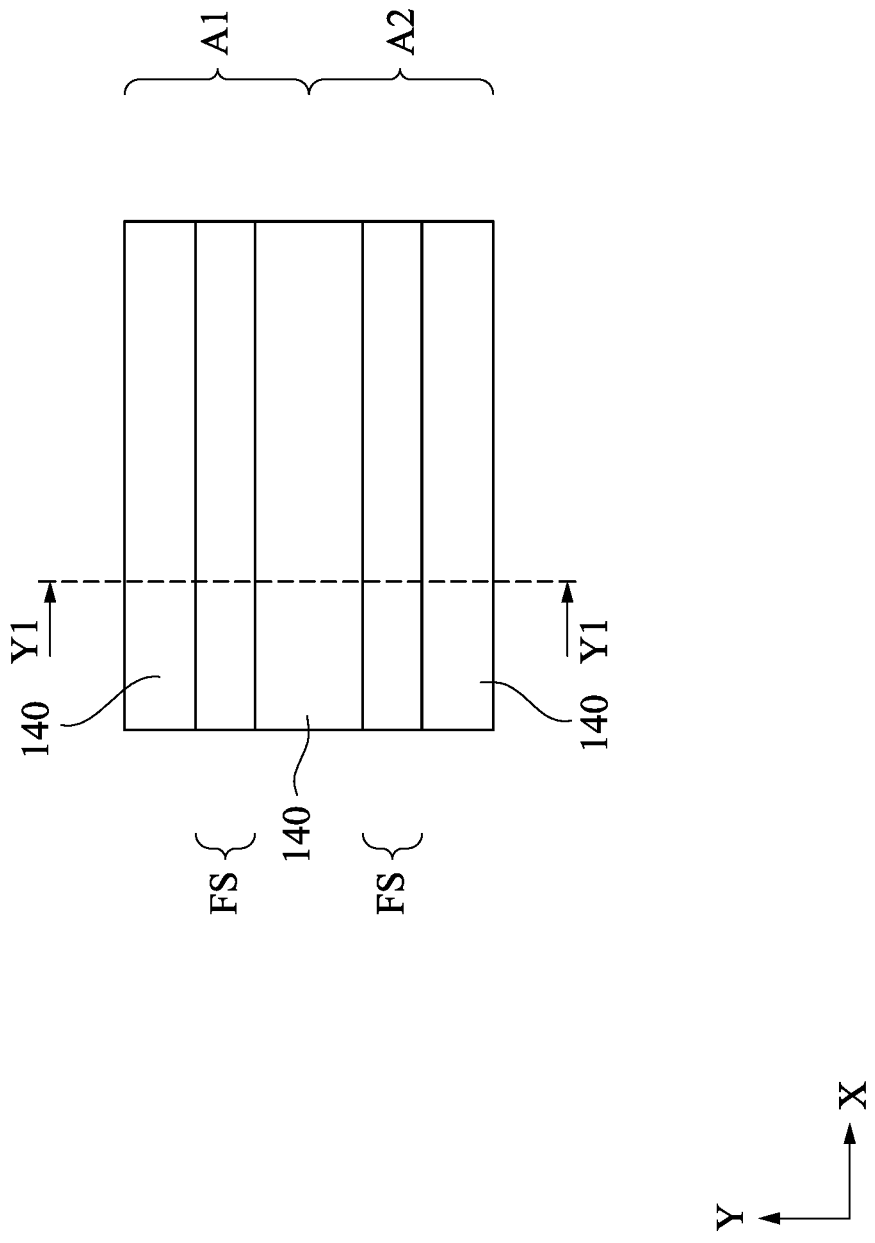
Figure 4B:
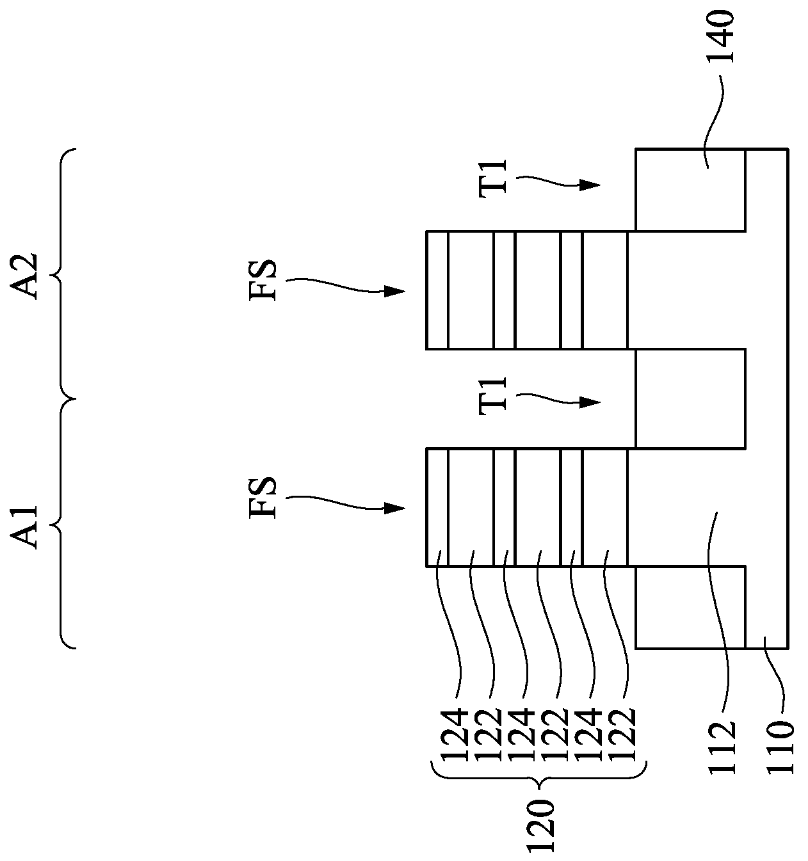
Figure 5C:
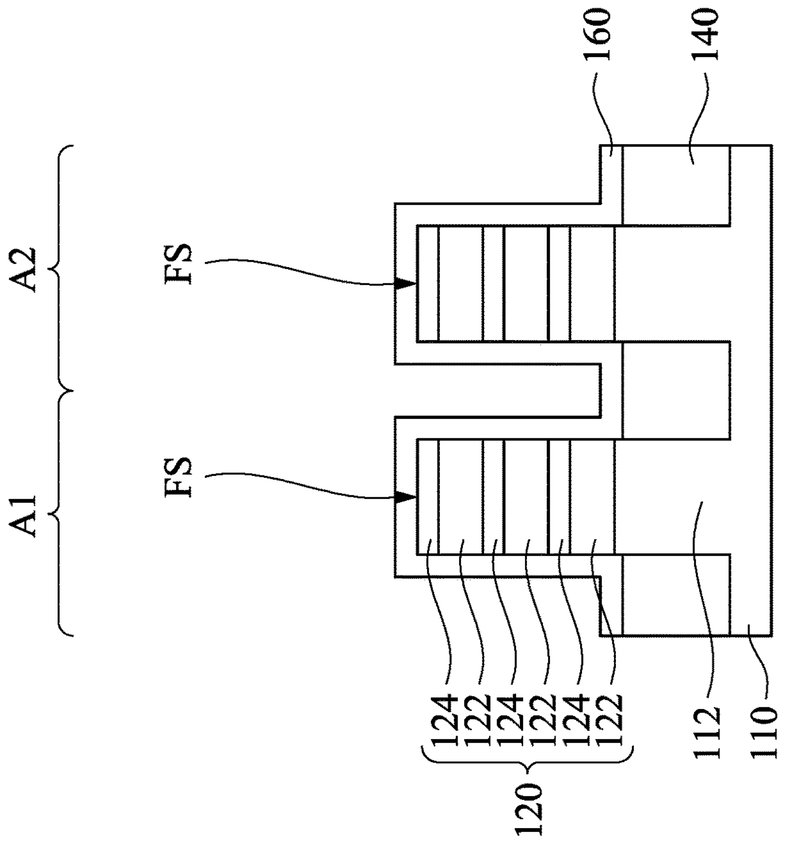
Figure 5B:
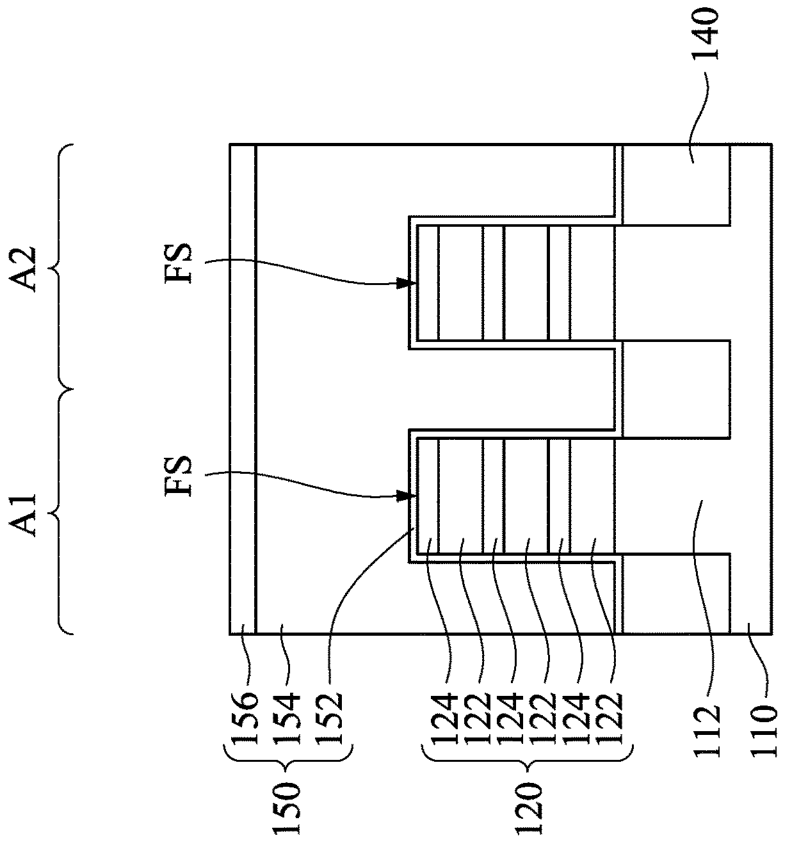
Figure 5D:
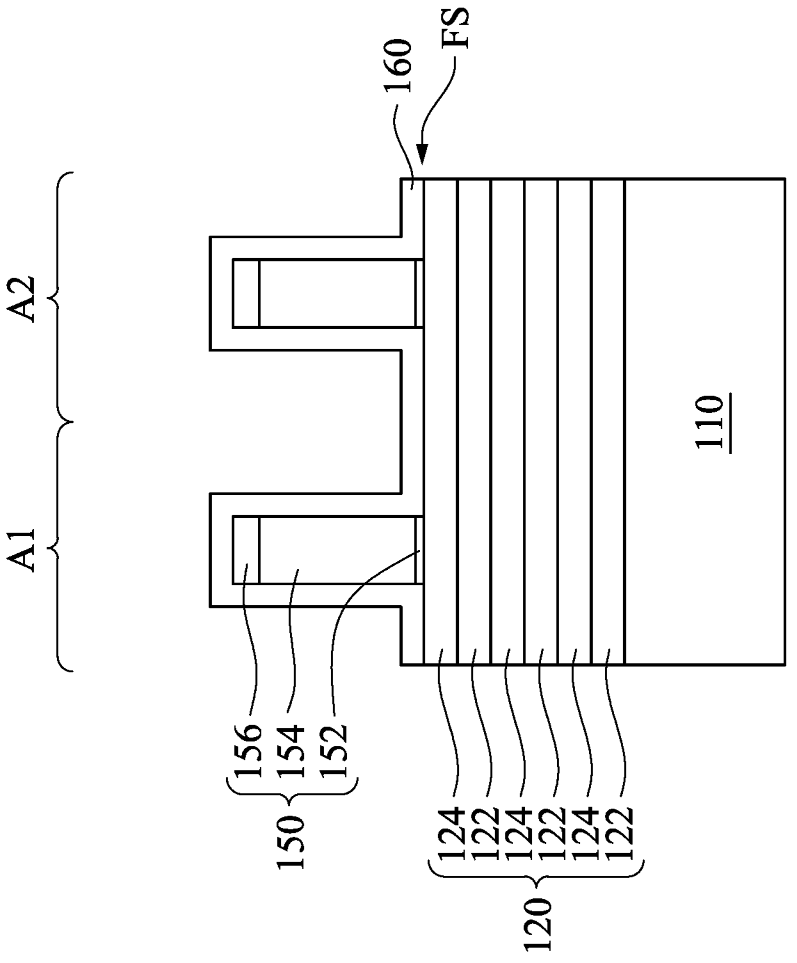

Reference is made to FIGS. 4A and 4B. Isolation structures 140 are formed in the trench T1 between the fins FS1. The isolation structure 140 may be a single-layer or a multi-layer structure. In some embodiments, the isolation structure 140 includes low-k (k<7) dielectric materials, SiN, SiCN, SiOC, SiOCN or the like. Formation of the isolation structure 140 may include depositing a dielectric material over the fins FS, followed by an etching back process. Through the etching back process, a top surface of the isolation structure 140 is lowered to a position lower than a bottommost surface of the layers 122, such that the sacrificial layers 122 and the channel layers 124 are exposed.

Reference is made to FIGS. 5A-5D. One or more dummy gate structures 150 are formed on the epitaxial stack 120. The dummy gate structure 150 may include a gate dielectric 152, a gate electrode 154, and a hard mask 156. The gate dielectric 152 may include one or more layers of dielectric material, such as silicon oxide, silicon nitride, a high-k dielectric material, and/or other suitable dielectric material. In some embodiments, the gate electrode 154 includes a material different than that of the gate dielectric 152. In some embodiments, the gate dielectric 152 may be deposited by a CVD process, a sub-atmospheric CVD (SACVD) process, a FCVD process, an ALD process, a PVD process, or other suitable process. The gate electrode 154 may include polycrystalline silicon (polysilicon). The hard mask 156 may include silicon oxide, silicon nitride, the like, or the combination thereof. In some embodiments, the materials of the dummy gate structures 150 are formed by various processes such as layer deposition, for example, CVD, PVD, ALD, thermal oxidation, or other suitable deposition techniques, or combinations thereof.

The dummy gate structures 150 may be formed by first depositing a blanket gate dielectric layer, a gate electrode layer, and a mask layer, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the dielectric layer, the gate electrode layer, and the mask layer, the fins FS are partially exposed on opposite sides of the dummy gate structure 150.

A spacer layer 160 is conformally formed on opposite sidewalls of the dummy gate structures 140. The spacer layer 160 may be made of a dielectric material such as silicon oxide, silicon nitride, silicon carbide, silicon oxynitride, SiCN, silicon oxycarbide, SiOCN, other low-k dielectric, the like, and/or combinations thereof. In some embodiments, the spacer layer 160 includes a single layer or multiple layers. In some embodiments, the spacer layer 160 may be further formed on opposite sides of the fins FS. The spacer layer 160 may be conformally deposited by ALD or CVD processes.

Reference is made to FIGS. 6A-6E. The spacer layer 160 (referring to FIGS. 5C and 5D) is etched back to form gate spacers 162 or/and fin sidewall spacers 164. The etching back process may include an anisotropic dry etch process. During the anisotropic dry etch process, most of the one or more spacer material layers are removed from horizontal surfaces, such as the tops of the fins FS, leaving the gate spacers 162 or/and the fin sidewall spacers 164 on the vertical surfaces, such as the sidewalls of the dummy gate structures 150 and sidewalls of the fins FS.

After formation of the dummy gate structures 150 and the gate spacers 162, exposed portions of the semiconductor fins FS that extend laterally beyond the gate spacers 162 (e.g., in source/drain regions of the fins FS) are etched by using, for example, an anisotropic etching process that uses the dummy gate structures 150 and the gate spacers 162 as an etch mask, resulting in recesses R1 and R2 into the semiconductor fins FS and between corresponding dummy gate structures 150. After the anisotropic etching, end surfaces of the sacrificial layers 122 and the channel layers 124 are exposed by the recesses R1 and R2 and aligned with respective outermost sidewalls of the gate spacers 162, due to the anisotropic etching. In some embodiments, the anisotropic etching may be performed by a dry chemical etch (e.g., reactive-ion etching) using suitable reaction gas, such as a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof. Through the etching process(es), top ends of the fin sidewall spacers 164 may be lowered to a position below tops of the fins FS. In some alternatively embodiments, the fin sidewall spacers 164 are entirely removed by etching the recesses R1 and R2.

The sacrificial layers 122 are laterally or horizontally recessed by using suitable selective etching process, resulting in lateral/sidewall recesses R3 vertically between corresponding channel layers 124, and vertically between the channel layer 124 and the substrate portion 112. For example, end surfaces of the sacrificial layers 122 are recessed by the selective etching process. The various compositions in epitaxial layers result in different oxidation rates and/or etch selectivity, thereby facilitating the selective etching process. In some embodiments, a selective dry etching process is performed by using fluoride-based etchant gas, such as $NF_3$, $SF_6$, the like, or the combination thereof. The fluoride-based gas may etch SiGe at a faster etch rate than it etches Si. The substrate portion 112 and the channel layers 124 may have a higher etch resistance to the selective etching process than that of the sacrificial layers 124. In some embodiments, the selective etching includes SiGe oxidation followed by a $SiGeO_x$ removal. For example, the oxidation may be provided by an oxygen-containing cleaning process and then $SiGeO_x$ removed by the fluoride-based plasma (e.g., $NF_3$ plasma) that selectively etches $SiGeO_x$ at a faster etch rate than it etches Si. Moreover, because oxidation rate of Si is much lower (sometimes 30 times lower) than oxidation rate of SiGe (or Ge), the channel layers 124 and the substrate portion 112 may not be not significantly etched by the process of laterally recessing the sacrificial layers 124. As a result, the channel layers 124 and the substrate portion 112 laterally extend past opposite end surfaces of the sacrificial layers 124.

Figure 6B:
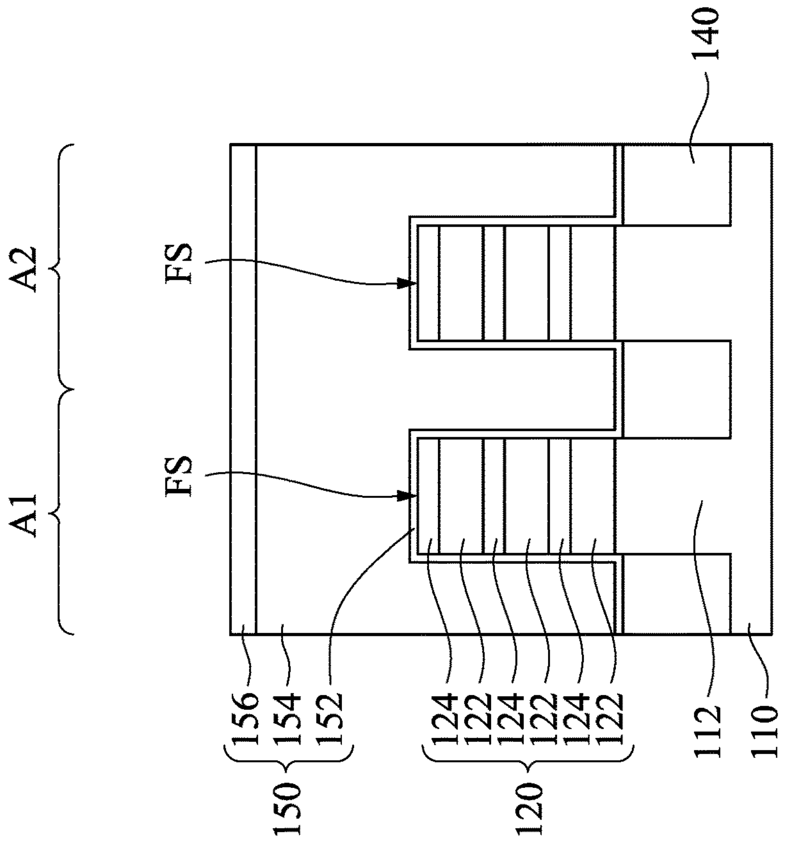
Figure 6C:
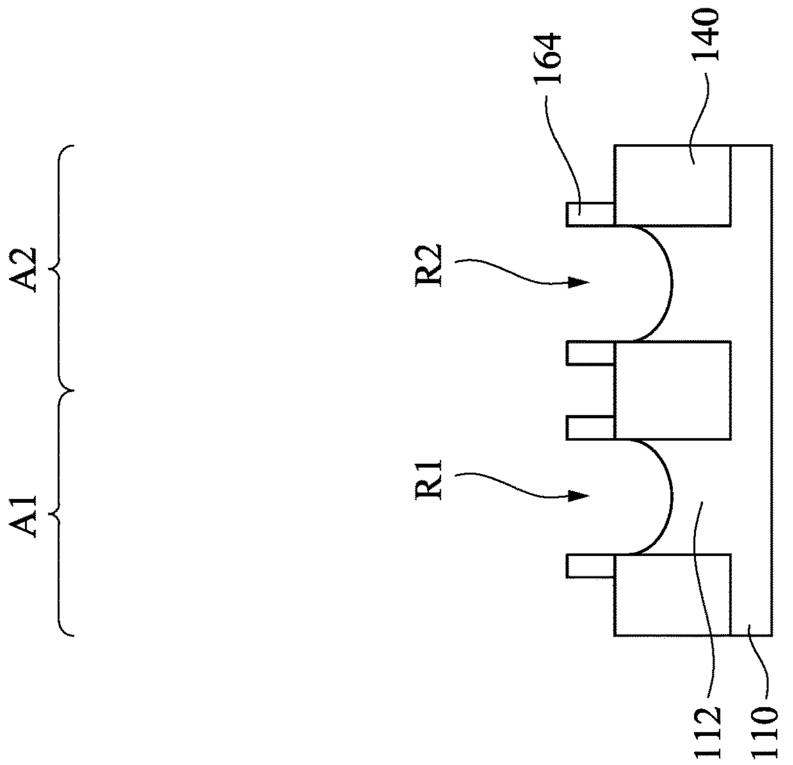
Figure 6E:
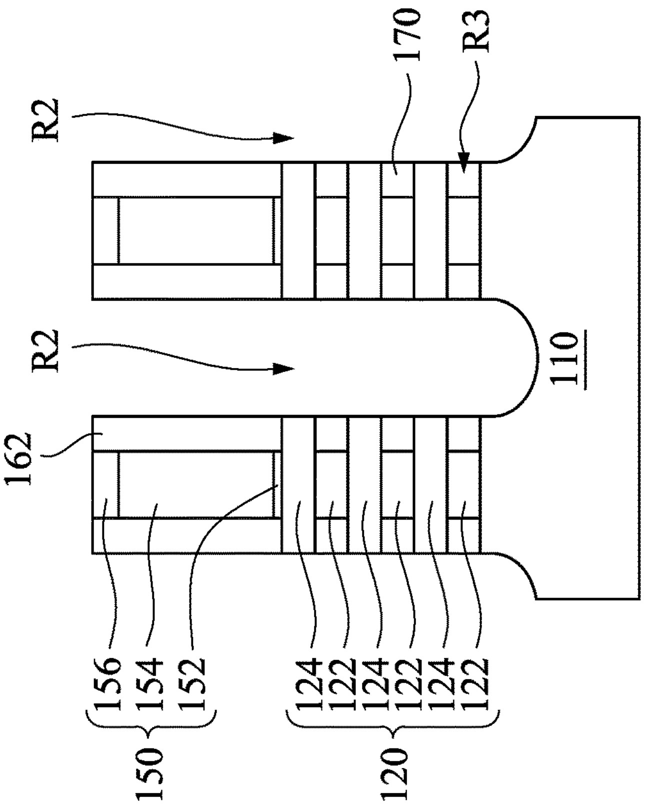
Figure 6D:
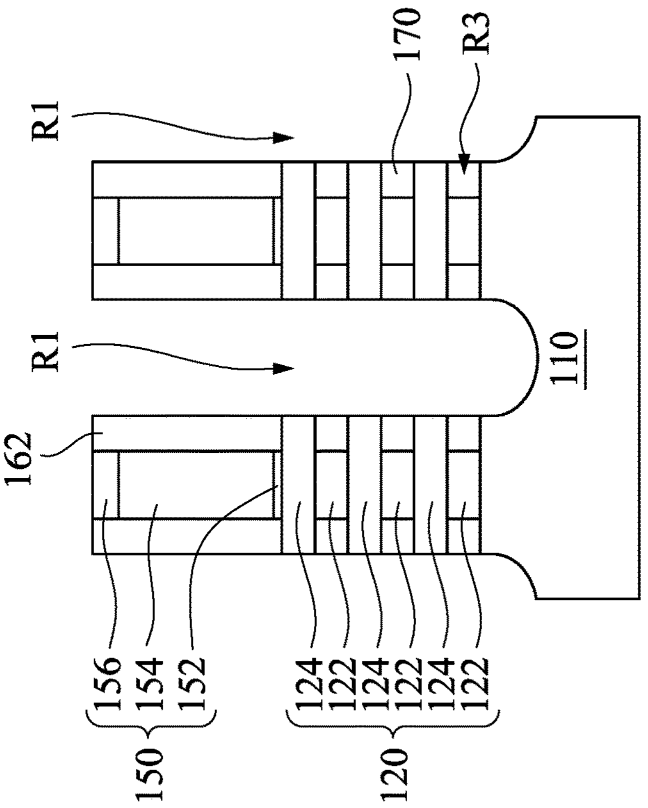

Inner spacers 170 are formed in the recesses R3. Stated differently, the inner spacers 170 may be formed on opposite end surfaces of the laterally recessed sacrificial layers 124. The inner spacers 170 may include a low-k dielectric material, such as $SiO_x$, SiON, SiOC, SiN, SiCN, or SiOCN. Formation of the inner spacers 170 may include depositing an inner spacer material layer, followed by an anisotropic etching process to trim the deposited inner spacer material layer. Through the anisotropic etching process, only portions of the deposited inner spacer material layer that fill the lateral/sidewall recesses R3 are left. The inner spacers 170 may include a single layer or multiple layers. The inner spacers 170 may serve to isolate metal gates from source/drain regions formed in subsequent processing. In the example of FIGS. 6D and 6E, sidewalls of the inner spacers 170 are aligned with sidewalls of the channel layers 124.

Figure 7A:
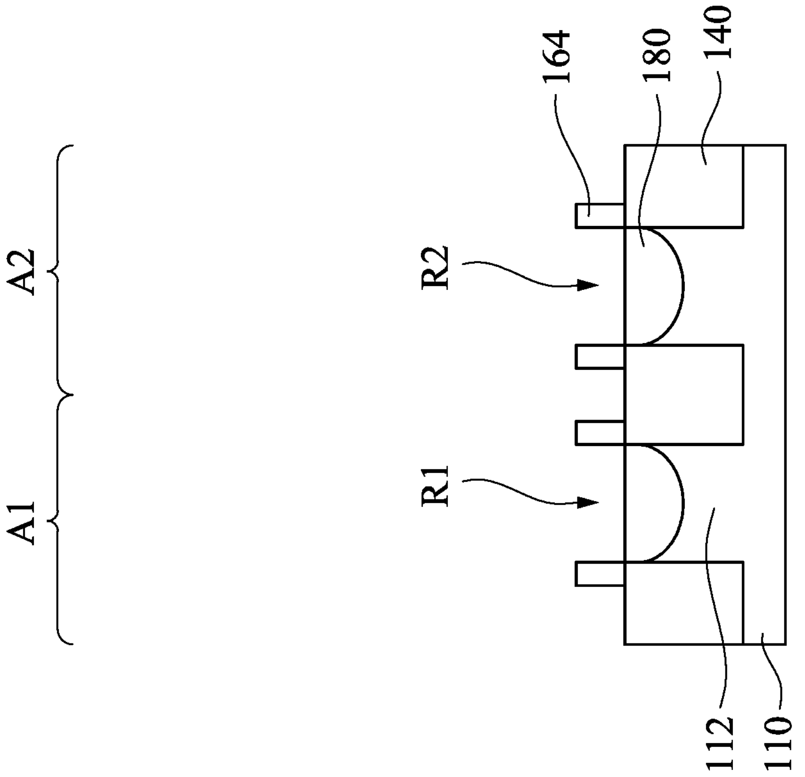
Figure 7B:
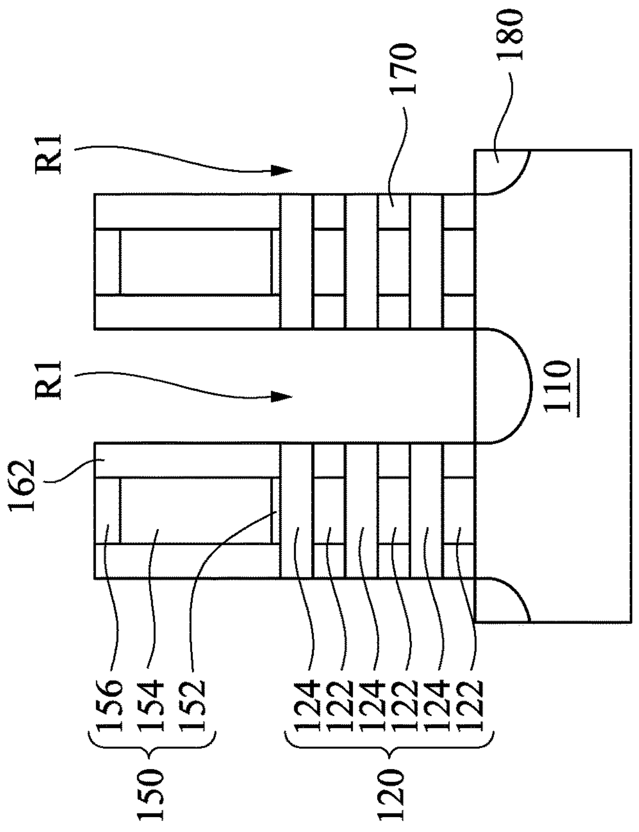
Figure 7C:
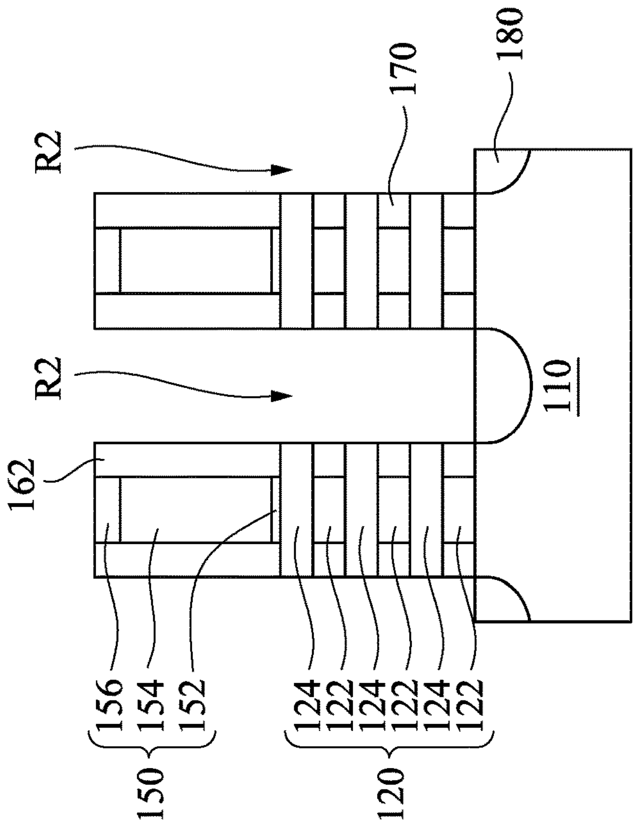

Reference is made to FIGS. 7A-7C. Epitaxial features 180 may be formed in the respective recesses R1 and R2. In some embodiments, an epitaxial growth process is performed to grow an epitaxial material in the recesses R1 and R2. The epitaxial material may have a composition similar to the substrate 110. For example, the substrate 110 and the epitaxial features 180 are Si. In some alternative embodiments, the epitaxial features 180 may have a composition different from that of the substrate 110. For example, the substrate 110 includes Si, and the epitaxial features 180 may include SiGe.

In some embodiments, the epitaxial features 180 are not intentionally doped, for example, not having intentionally placed dopants, but rather having a doping resulting from process contaminants. For example, the epitaxial features 180 are not intentional doped (NID) semiconductor layers and thus free from p-type dopants (e.g., boron) and n-type dopants (e.g., phosphorous) in subsequent doped source/drain epitaxial features. Alternatively, the epitaxial features 180 may be doped with p-type dopants (e.g., boron) or n-type dopants (e.g., phosphorous), and with a doping concentration lower than that of the doped source/drain epitaxial features. For example, the epitaxial features 180 have dopant concentration lower than about $10^{13}/cm^3$.

In some embodiments, in order to prevent the epitaxial material of the epitaxial features 180 from being inadvertently formed on end surfaces of the channel layers 124, the epitaxial features 180 can be grown in a bottom-up manner, in accordance with some embodiments of the present disclosure. By way of example and not limitation, the epitaxial features 180 can be grown by an epitaxial deposition/partial etch process, which repeats the epitaxial deposition/partial etch process at least once. Such repeated deposition/partial etch process is also called a cyclic deposition-etch (CDE) process. In some embodiments, these epitaxial features 180 are grown by selective epitaxial growth (SEG), where an etching gas is added to promote the selective growth of the epitaxial material from the bottom surface of the recesses R1 and R2 that has a first crystal plane, but not from the vertical end surfaces of the channel layers 124 that have a second crystal plane different from the first crystal plane.

Figure 8:
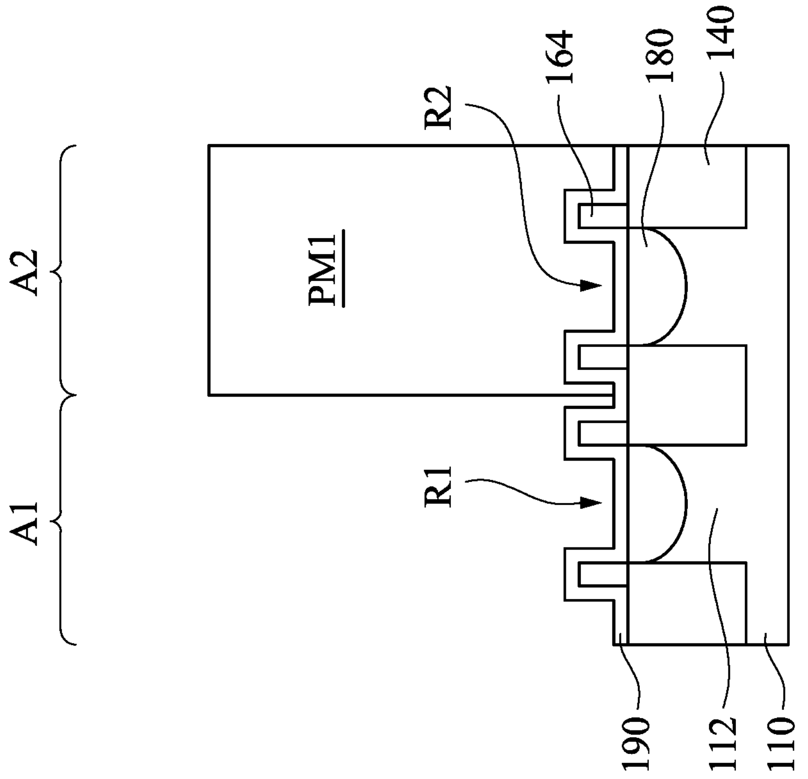

Reference is made to FIG. 8. A hard mask layer 190 is deposited over the structure of FIG. 7A, and a patterned mask PM1 is formed over the hard mask layer 190. The hard mask layer 190 may include a suitable dielectric material different from that of the fin sidewall spacers 164. For example, the hard mask layer 190 may be made of a dielectric material such as silicon oxide, silicon nitride, silicon carbide, silicon oxynitride, SiCN, silicon oxycarbide, SiOCN, aluminum oxide, the like, and/or combinations thereof.

A patterned mask PM1 may be formed to cover the second region A2 (e.g., n-type region). In some embodiments, the patterned mask PM1 may include a photoresist formed by a photolithography process. An exemplary photolithography process may include processing steps of photoresist coating, soft baking, mask aligning, exposing, post-exposure baking, developing photoresist and hard baking.

Figure 9A:
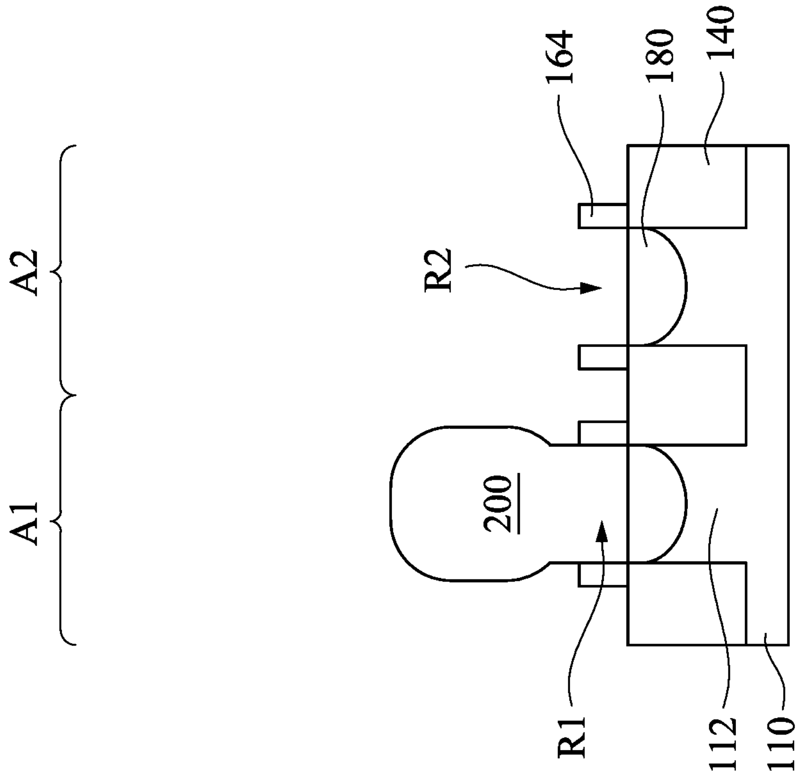
Figure 9C:
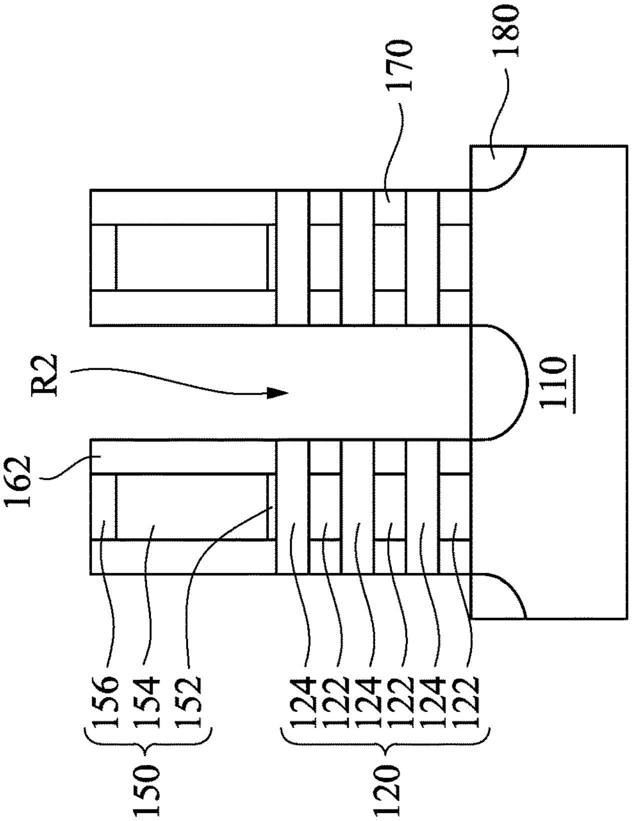
Figure 9B:
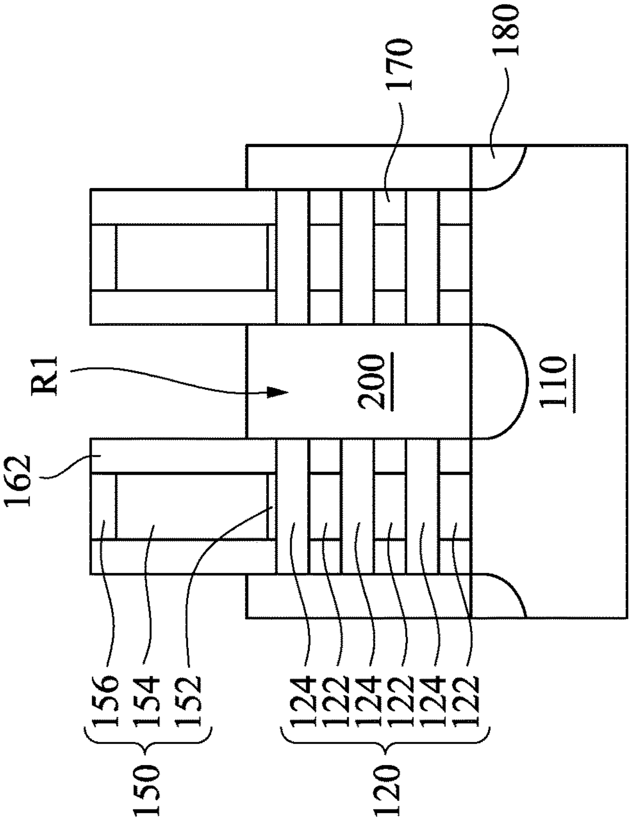

Reference is made to FIGS. 9A-9C. A portion of the hard mask layer 190 (referring to FIG. 8) over the first region A1 is removed by suitable etching/clean process to expose the first region A1. After the removal of the portion of the hard mask layer 190 (referring to FIG. 8), the patterned mask PM1 (referring to FIG. 8) may be removed by suitable stripping or ashing process. Then, source/drain epitaxial structures 200 are formed over the epitaxial features 180 in the exposed first region A1 (e.g., p-type region). The formation of the source/drain epitaxial structure 200 may be formed by performing an epitaxial growth process that provides an epitaxial material on the epitaxial feature 180. During the epitaxial growth process, the gate spacers 162, fin sidewall spacers 164, and the inner spacers 170 limit the source/drain epitaxial structures 200 to the source/drain regions. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the epitaxial feature 180 and the channel layers 124.

In some embodiments, the source/drain epitaxial structure 200 may include Ge, Si, GaAs, AlGaAs, SiGe, GaAsP, SiP, or other suitable material. The source/drain epitaxial structure 200 may be in-situ doped during the epitaxial process by introducing first-type doping species. In some embodiments where a p-type device is to be formed over the first region A1, the first-type doping species include p-type dopants, such as boron or $BF_2$. In some embodiments where an n-type device is to be formed over the first region A1, the first-type doping species include n-type dopants, such as phosphorus or arsenic. If the source/drain epitaxial structure 200 are not in-situ doped, an implantation process (i.e., a junction implant process) is performed to dope the source/drain epitaxial structure 200. The source/drain epitaxial structures 200 may have dopant concentration greater than about $10^{18}/cm^3$. After the formation of the source/drain epitaxial structures 200, a remaining portion of the hard mask layer 190 (referring to FIG. 8) over the second region A2 is removed by suitable etching/clean process.

Figure 10:
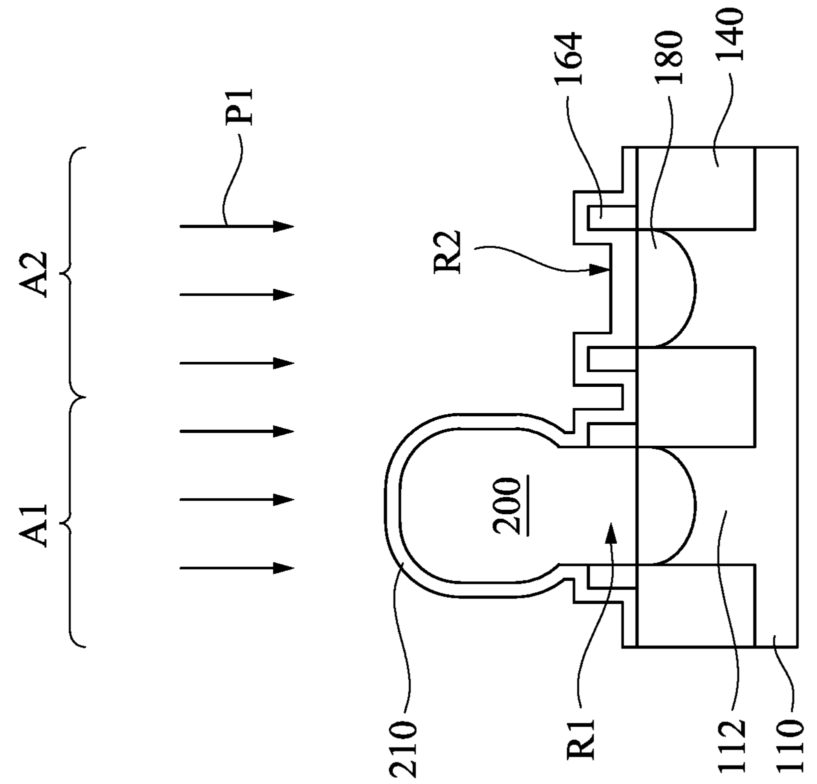
Figure 11:
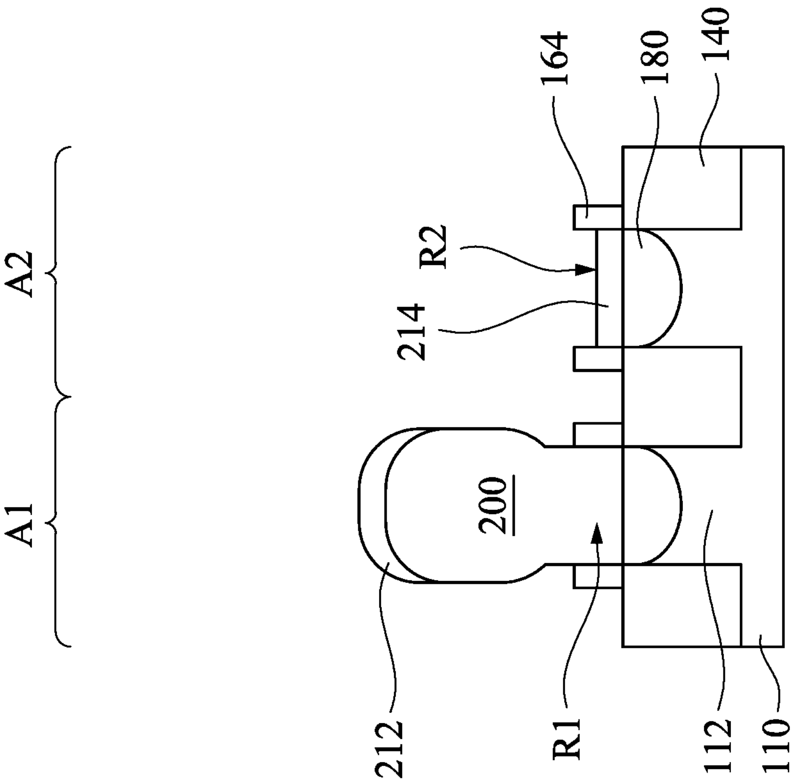

Reference is made to FIG. 10. A dielectric film 210 is conformally deposited over the structure of FIG. 9A. The dielectric film 210 may include $SiO_2$, SiN, SiCN, SiCON, SiCO, AlO, HfO, other high k dielectric material, the like, or the combination thereof. The dielectric film 210 may be a single film or a multi-layered film. The dielectric film 210 is patterned into a regional layer 212 over the source/drain epitaxial structure 200 in the first region A1 and an isolation layer 214 over the substrate portion 112 in the second region A2. The resulted structure is illustrated in FIG. 11. The patterning process includes an implantation process P1 followed by an etching process. The implantation process P1 may include dope atoms (e.g., nitrogen plasma) into the dielectric film 210 (referring to FIG. 10), resulting portions of the dielectric film 210 being doped with a higher nitrogen concentration. The etching process may remove undoped portions of the dielectric film 210 with a lower nitrogen concentration, and not substantially remove the doped portions of the dielectric film 210 with the higher nitrogen concentration. After the etching process, the doped portions of the dielectric film 210 form the regional layer 212 and the isolation layer 214 in FIG. 11. In the present embodiments, the implantation process P1 is performed along a direction substantially along a direction normal to the substrate 110, and therefore the regional layer 212 (i.e., the doped region) may not cover lateral sidewalls of the epitaxial structure 200. In some alternative embodiments, the implantation process may be performed at an oblique angle with respect to the directional normal to the substrate 110, and therefore the regional layer 212 (i.e., the doped region) may cover lateral sidewalls of the epitaxial structure 200. The regional layer 212 may be referred to as a CESL in some embodiments. Referring to FIG. 11, the isolation layer 214 may be in contact with the fin sidewall spacers 164 for providing better electrical isolation between the substrate 110 and subsequently-formed source/drain epitaxial feature.

Figure 12:
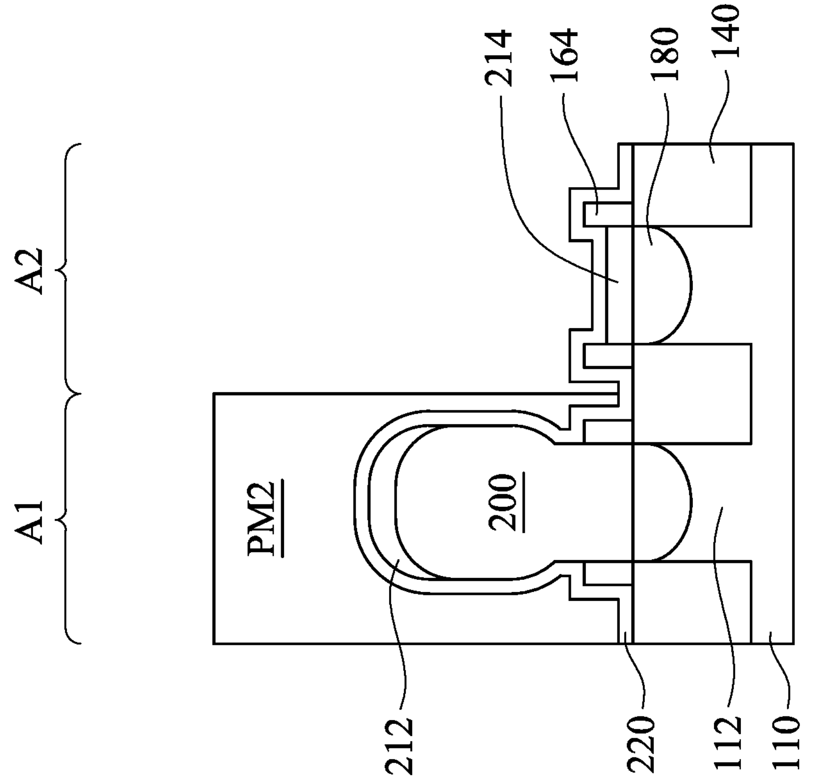

Reference is made to FIG. 12. A hard mask layer 220 is deposited over the structure of FIG. 11, and a patterned mask PM2 is formed over the hard mask layer 220. The hard mask layer 220 may include a suitable dielectric material different from that of the fin sidewall spacers 164. For example, the hard mask layer 220 may be made of a dielectric material such as silicon oxide, silicon nitride, silicon carbide, silicon oxynitride, SiCN, silicon oxycarbide, SiOCN, aluminum oxide, the like, and/or combinations thereof.

A patterned mask PM2 may be formed to cover the first region A1 (e.g., p-type region). In some embodiments, the patterned mask PM2 may include a photoresist formed by a photolithography process. An exemplary photolithography process may include processing steps of photoresist coating, soft baking, mask aligning, exposing, post-exposure baking, developing photoresist and hard baking.

Figure 13B:
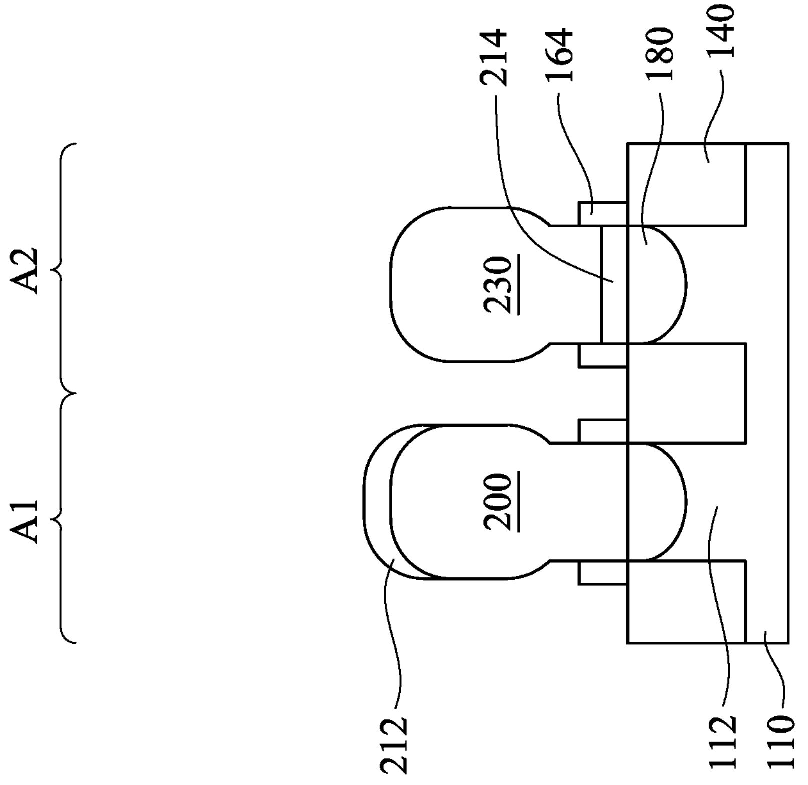
Figure 13D:
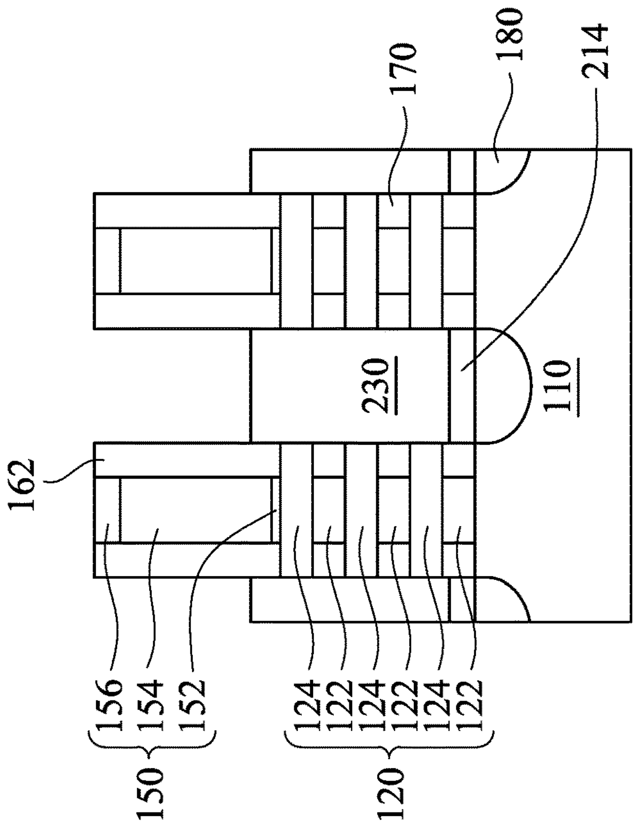
Figure 13C:
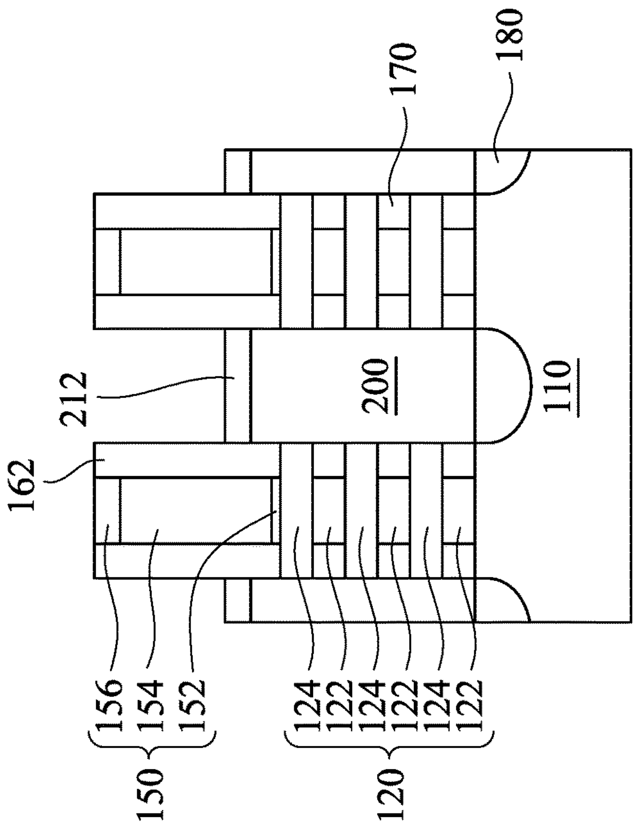

Reference is made to FIGS. 13A-13C. A portion of the hard mask layer 220 (referring to FIG. 12) over the second region A2 exposed by the patterned mask PM2 (referring to FIG. 12) is removed by suitable etching/clean process to expose the second region A2. After the removal of the portion of the hard mask layer 220, the patterned mask PM2 (referring to FIG. 12) may be removed by suitable stripping or ashing process. Then, source/drain epitaxial structures 230 are formed over the second region A2 (e.g., n-type region). The formation of the source/drain epitaxial structure 230 may be formed by performing an epitaxial growth process that provides an epitaxial material on the isolation layer 214. During the epitaxial growth process, the gate spacers 162, the fin sidewall spacers 164, and the inner spacers 170 limit the source/drain epitaxial structures 230 to the source/drain regions. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the channel layers 124.

In some embodiments, the source/drain epitaxial structure 230 may include Ge, Si, GaAs, AlGaAs, SiGe, GaAsP. SiP, or other suitable material. The source/drain epitaxial structure 230 may be in-situ doped during the epitaxial process by introducing second-type doping species. In some embodiments where an n-type device is to be formed over the second region A2, the second-type doping species include n-type dopants, such as phosphorus or arsenic. In some embodiments where a p-type device is to be formed over the second region A2, the second-type doping species include p-type dopants, such as boron or $BF_2$. If the source/drain epitaxial structure 230 are not in-situ doped, an implantation process (i.e., a junction implant process) is performed to dope the source/drain epitaxial structure 230. The source/drain epitaxial structures 230 may have dopant concentration greater than about $10^{18}/cm^3$. After the formation of the source/drain epitaxial structures 230, a remaining portion of the hard mask layer 220 (referring to FIG. 12) over the first region A1 is removed by suitable etching/clean process.

Figure 14A:
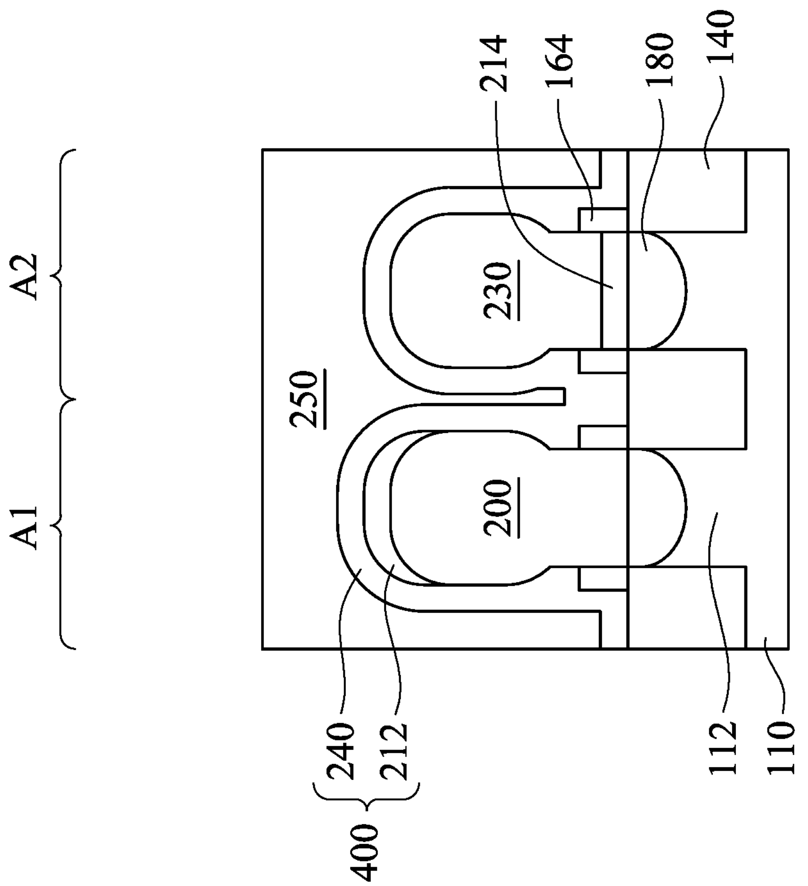
Figure 14B:
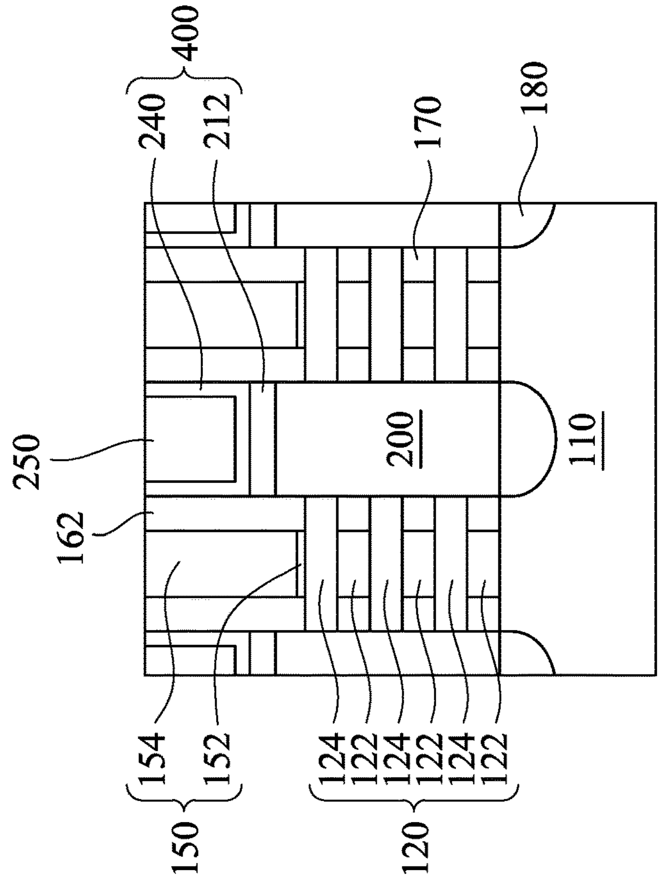
Figure 14C:
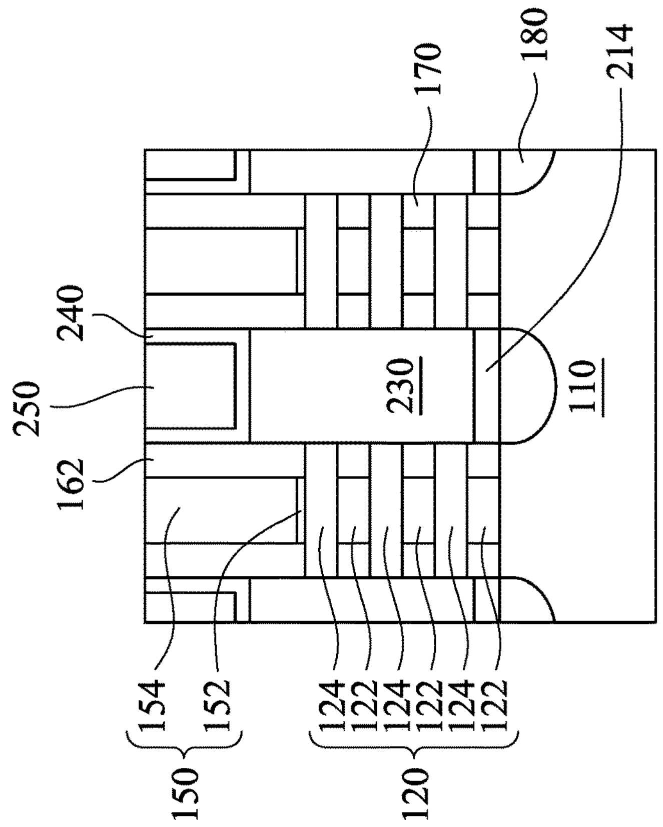
Figure 15B:
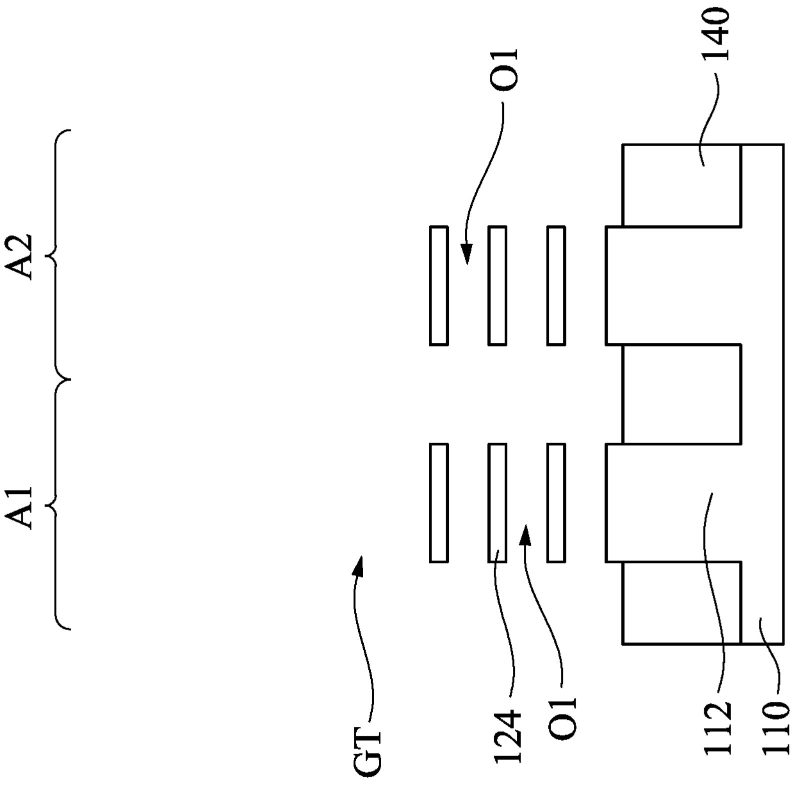
Figure 15C:
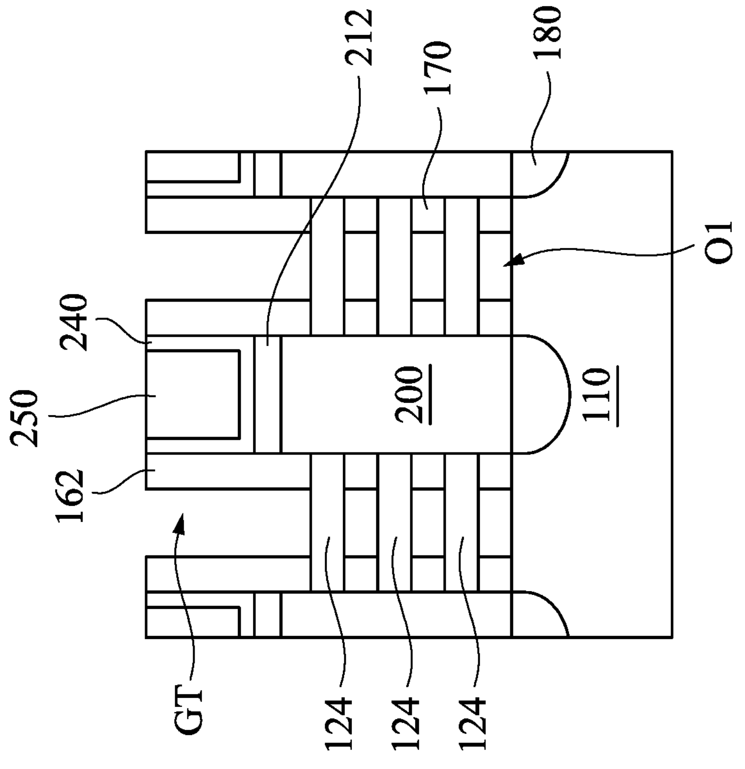
Figure 15D:
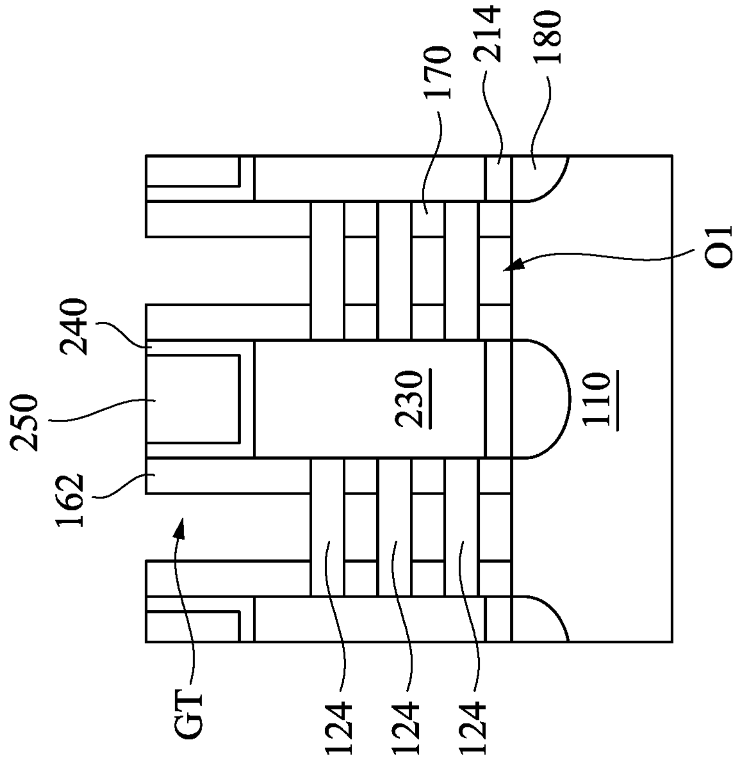
Figure 16A:
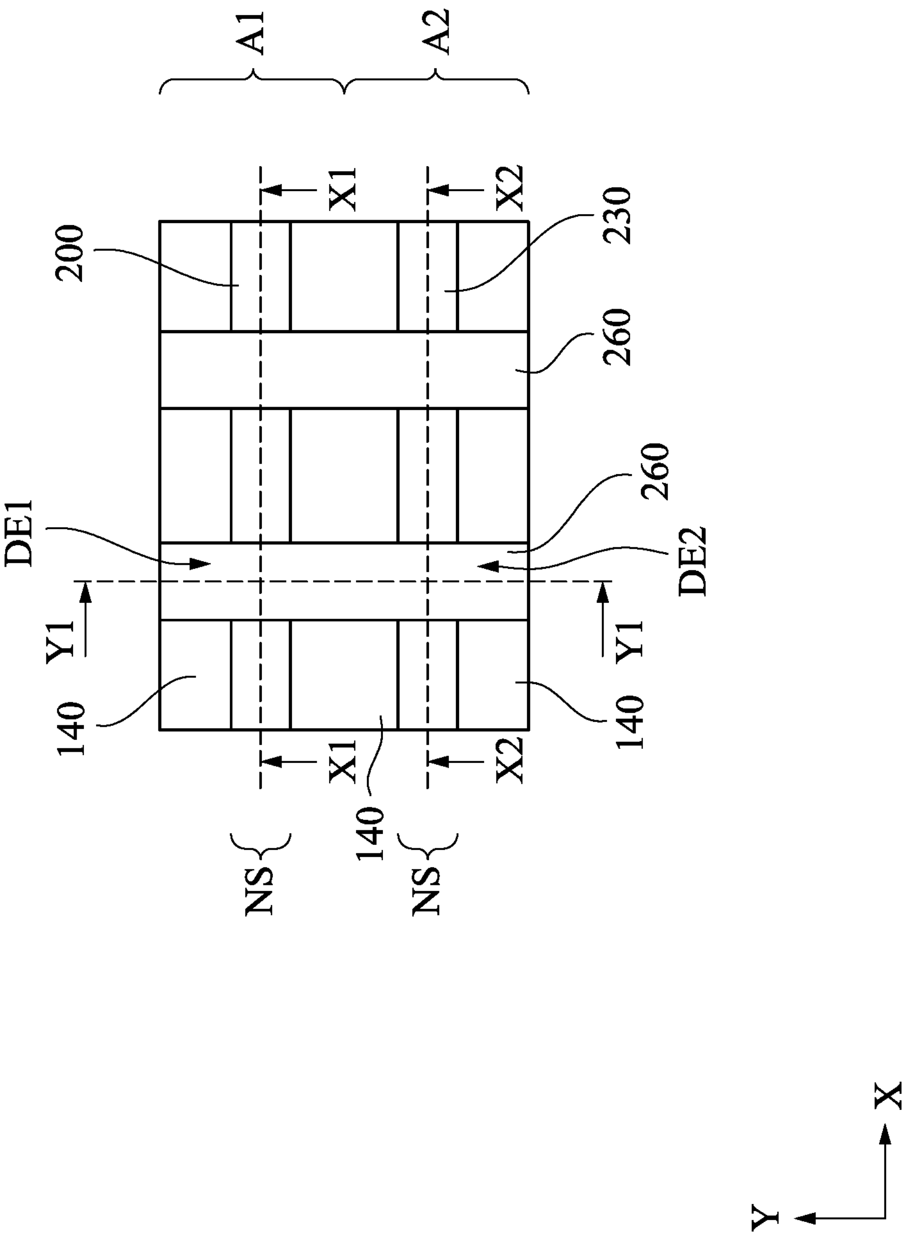
Figure 16B:
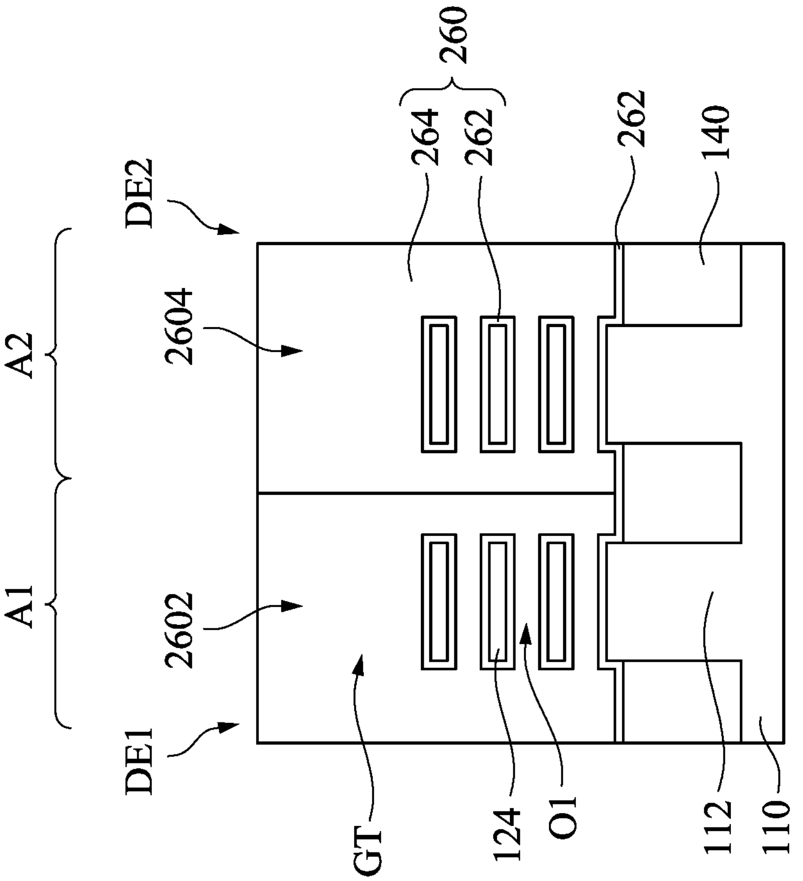
Figure 16D:
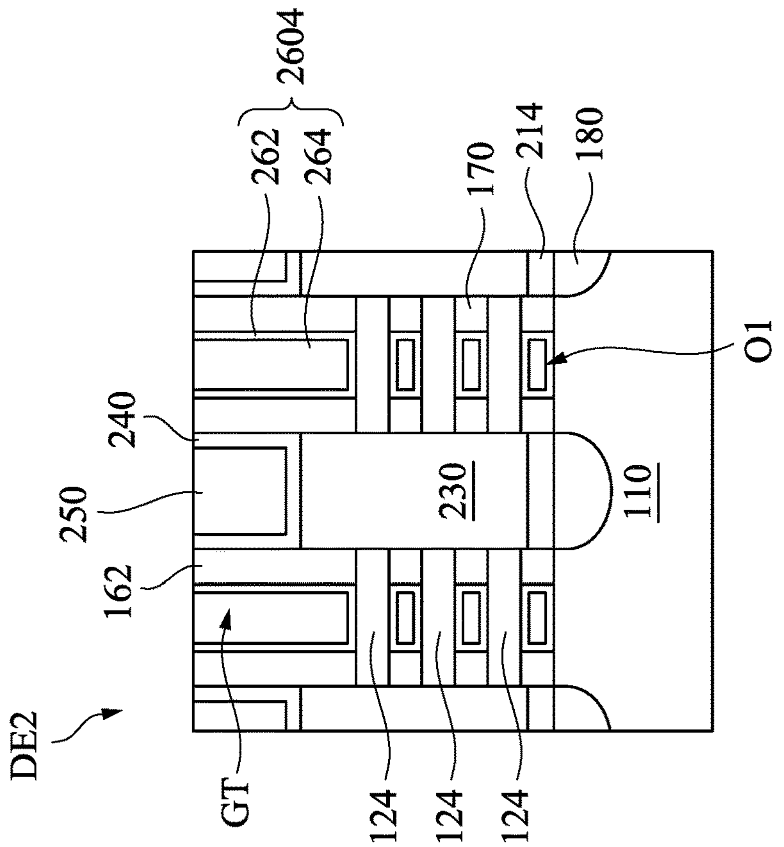
Figure 16C:
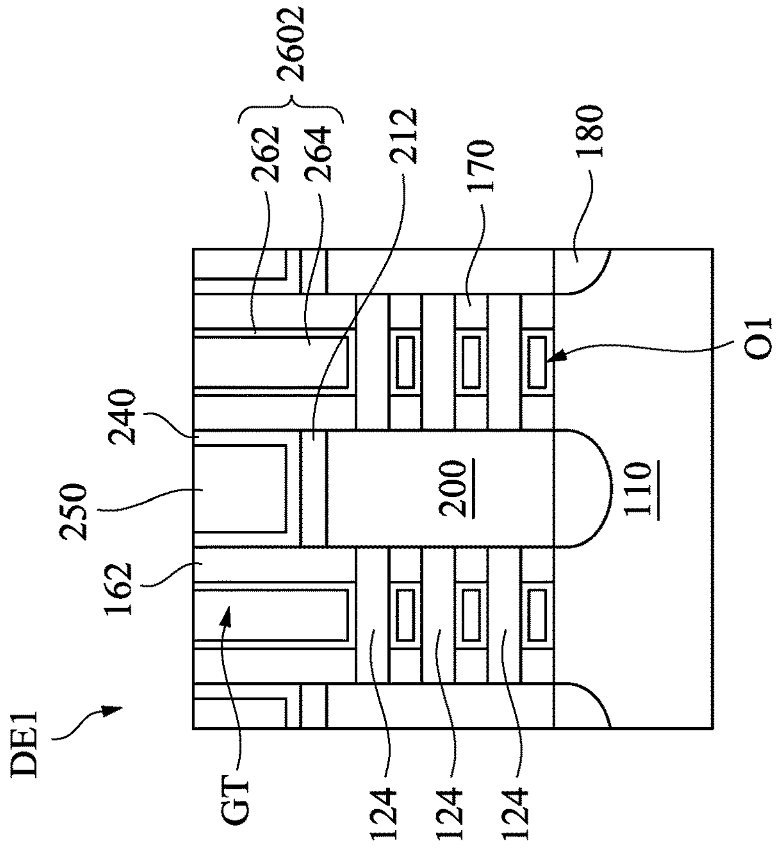

Reference is made to FIGS. 14A-14C. A dielectric layer 240 is conformally deposited over the structure of FIG. 13C. The dielectric layer 240 may include $SiO_2$, SiN, SiCN, SiCON, SiCO, AlO, HfO, other high k dielectric material, the like, or the combination thereof. In some embodiments, the dielectric layer 240 includes a material different from that of the regional layer 212. For example, the dielectric layer 240 includes SiCON and SiN, the regional layer 212 includes SiN, and thus an oxygen concentration of the dielectric layer 240 is greater than that of the regional layer 212. In some other embodiments, the dielectric layer 240 includes a dielectric material the same as that of the regional layer 212. The dielectric layer 240 may be a single film or a multi-layered film. In some embodiments, the dielectric layer 240 may be referred to as CESL. In some embodiments, a combination of the dielectric layer 240 and the regional layer 212 are referred to as CESL 400.

An interlayer dielectric (ILD) layer 250 is formed over the CESL 400 and filling the space between the dummy gate structures 150. The ILD layer 250 may include materials different from the dielectric layer 240 and the regional layer 212 of the CESL 400. For example, the ILD layer 250 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 250 may be deposited by a PECVD process or other suitable deposition technique. In some embodiments, after formation of the ILD layer 250, the semiconductor device may be subject to a high thermal budget process to anneal the ILD layer 250. After depositing the ILD layer 250, a planarization process may be performed to remove excessive materials of the ILD layer 250 and the dielectric layer 240. For example, a planarization process includes a chemical mechanical planarization (CMP) process which removes portions of the ILD layer 250 and the dielectric layer 240 overlying the dummy gate structures 150 and planarizes a top surface of the semiconductor device. The planarization process may also remove the hard mask 156 of the dummy gate structures 150 (referring to FIGS. 13C and 13D) to expose the underlying dummy gate electrode 154.

FIGS. 15A-16D shows a gate replacement process. The dummy gate structures 150 and the sacrificial layers 122 (referring to FIGS. 14B and 14C) are replaced with high-k/metal gate structures 260. Reference is made to FIGS. 15A-15D. The dummy gate structures 150 (referring to FIGS. 14B and 14C) are removed, followed by removing the sacrificial layers 122 (referring to FIGS. 14B and 14C). The removal of the dummy gate structures 150 (referring to FIGS. 14B and 14C) includes removing the gate dielectric 152 and then removing the gate electrode 154. In the illustrated embodiments, the dummy gate structures 150 (referring to FIGS. 14B and 14C) are removed by using a selective etching process (e.g., selective dry etching, selective wet etching, or a combination thereof) that etches the materials in dummy gate structures 150 (referring to FIGS. 14B and 14C) at a faster etch rate than it etches other materials (e.g., gate spacers 162 and/or the ILD layer 250), thus resulting in gate trenches GT between corresponding gate spacers 162, with the sacrificial layers 122 (referring to FIGS. 14B and 14C) exposed in the gate trenches GT. Subsequently, the sacrificial layers 122 (referring to FIGS. 14B and 14C) in the gate trenches GT are etched by using another selective etching process that etches the sacrificial layers 122 at a faster etch rate than it etches the channel layers 124, thus forming openings/spaces O1 between neighboring channel layers 124. The openings/spaces O1 may expose the sidewalls of the inner spacers 170. In this way, the channel layers 124 become nanosheets suspended over the substrate 110 and between the source/drain epitaxial structures 200/230. According to the pattern of fins FS (referring to FIG. 13A), plural subsects of channel layers 124 (denoted as nanosheet subsets NS) remain over the substrate 110. This step is also called a channel release process. At this interim processing step, the openings/spaces O1 between nanosheets 124 may be filled with ambient environment conditions (e.g., air, nitrogen, etc).

In some embodiments, the sacrificial layers 122 (referring to FIGS. 14B and 14C) are removed by using a selective dry etching process. In some embodiments, the sacrificial layers 122 (referring to FIGS. 14B and 14C) are SiGe and the channel layers 124 are silicon allowing for the selective removal of the sacrificial layers 122 (referring to FIGS. 14B and 14C). In some embodiments, the selective dry etching may use chloride-based gases, such as $CF_4$, $C_4F_8$, the like, or the combination thereof. In some embodiments, the selective removal includes SiGe oxidation followed by a $SiGeO_x$ removal. For example, the oxidation may be provided by $O_2$ plasma and then $SiGeO_x$ removed by the chloride-based plasma (e.g., $CF_4/C_4F_8$ plasma) that selectively etches $SiGeO_x$ at a faster etch rate than it etches Si, and stops on SiGe. The steps of SiGe oxidation and $SiGeO_x$ removal may be repeated until the sacrificial layers 122 are fully removed.

Reference is made to FIGS. 16A-16D. Replacement gate structures 260 are respectively formed in the gate trenches GT to surround each of the nanosheets 124 suspended in the gate trenches GT. The gate structures 260 may be final gates of GAA FETs. The final gate structure may be a high-k/metal gate stack, however other compositions are possible. In some embodiments, each of the gate structures 260 forms the gate associated with the multi-channels provided by the plurality of nanosheets 124. For example, the high-k/metal gate structures 260 are formed within the openings/spaces O1 provided by the release of nanosheets 124. The high-k/metal gate structures 260 may be between the nanosheets 124 and surrounded by the inner spacers 170.

In various embodiments, the high-k/metal gate structures 260 includes a gate dielectric layer 262 formed around the nanosheets 124 and a gate metal layer 264 formed around the gate dielectric layer 262 and filling a remainder of gate trenches GT. Formation of the high-k/metal gate structures 260 may include one or more deposition processes to form various gate materials, followed by a CMP process to remove excessive gate materials, resulting in the high-k/metal gate structures 260 having top surfaces level with a top surface of the ILD layer 250. Thus, transistors (e.g., GAA FET) DE1 and DE2 are formed, and the high-k/metal gate structures 260 surrounds each of the nanosheets 124, and thus is referred to as a gate of the transistors (e.g., GAA FET) DE1 and DE2.

The gate dielectric layer 262 may include an interfacial layer and a high-k gate dielectric layer over the interfacial layer. In some embodiments, the interfacial layer is silicon oxide formed on exposed surfaces of semiconductor materials in the gate trenches GT by using, for example, thermal oxidation, chemical oxidation, wet oxidation or the like. As a result, surface portions of the nanosheets 124 and the substrate 110 exposed in the gate trenches GT are oxidized into silicon oxide to form interfacial layer. In some embodiments, the high-k gate dielectric layer includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 264 includes one or more metal layers. For example, the gate metal layer 264 may include one or more work function metal layers stacked one over another. The one or more work function metal layers in the gate metal layer 264 provide a suitable work function for the high-k/metal gate structures 260 according to the conductivity types of the devices. The high-k/metal gate structure 260 is denoted as high-k/metal gate structures 2602 and 2604 for transistors DE1 and DE2 in the regions A1 and A2, respectively.

In some embodiments, the transistors DE1 in the region A1 are p-type GAA FET, and the transistors DE2 in the region A2 are n-type GAA FET. In some embodiments where the transistors DE1 are p-type GAA FET, the gate metal layer 264 of the high-k/metal gate structures 2602 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments where the transistors DE2 are n-type GAA FET, the gate metal layer 264 of the high-k/metal gate structures 2604 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten (W), and/or other suitable materials. In some alternative embodiments, the transistors DE1 in the region A1 are n-type GAA FET, the gate metal layer 264 of the high-k/metal gate structures 2602 may include one or more n-type work function metal (N-metal) layers, the transistors DE2 in the region A2 are p-type GAA FET, and the gate metal layer 264 of the high-k/metal gate structures 2604 may include one or more p-type work function metal (P-metal) layers. In some embodiments, the gate metal layers 264 of the high-k/metal gate structures 2602 and 2604 may include the same work function metal layers for n-type devices and p-type devices. In some embodiments, the gate metal layers 264 of the high-k/metal gate structures 2602 and 2604 may include different work function metal layers for n-type devices and p-type devices.

In some embodiments, the work function metal layer(s) may fill the gate trenches GT. In some alternative embodiments, the gate metal layer 264 may also include and a fill metal over the work function metal layer(s) and filling up a remainder of the gate trenches GT. In some embodiments, the fill metal in the gate metal layer 264 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. The gate metal layers 264 of the high-k/metal gate structures 2602 and 2604 may include the same fill metal for n-type devices and p-type devices.

Figure 17:
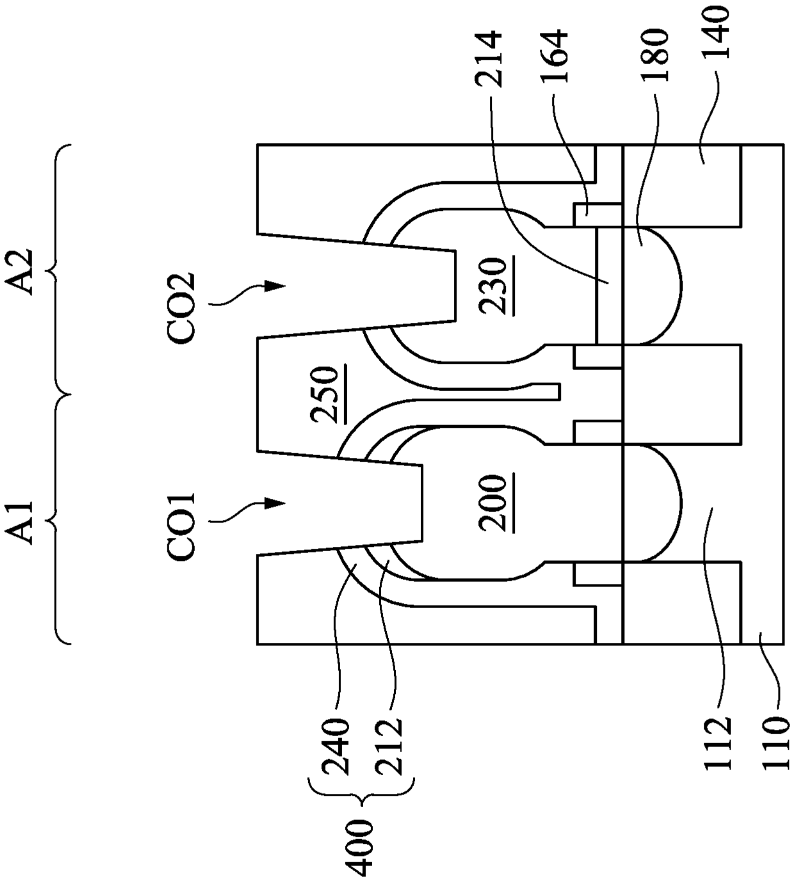

Reference is made to FIG. 17. One or more etching processes is performed to form source/drain contact openings CO1 and CO2 by removing portions the ILD layer 250 and the CESL 400. The source/drain contact openings CO1 and CO2 may extend through the ILD layer 250 and the CESL 400, and expose top surfaces of the source/drain epitaxial structures 200 and 230, respectively. In some embodiments, a patterned mask may be formed to cover portions of the ILD layer 250 prior to the etching process. In some embodiments, the patterned mask may include a photoresist formed by a photolithography process. The patterned mask may protect the regions of the ILD layer 250 from being etched. After the etching process, the patterned mask may be removed by suitable stripping or ashing process.

In some embodiments of the present disclosure, the source/drain contact openings CO1 and CO2 are etched by using the same etch recipe(s). For example, the source/drain contact openings CO1 and CO2 are etched by using a first gas etchant for removing the ILD layer 250 and a second gas etchant for removing the CESL 400 after the first gas etchant. Due to the thickness different between the CESL 400 over the source/drain epitaxial structures 200 and 230, and the etch selectivity between the CESL and the epitaxial materials in the source/drain epitaxial structures 200 and 230, the source/drain contact opening CO2 is deeper than the source/drain contact opening CO1. For example, a depth difference between the source/drain contact opening CO1 and CO2 may be in a range from about 2 nanometers to about 20 nanometers. If the depth difference is less than about 2 nanometers or greater than about 20 nanometers, device performance may degrade. Through the configuration, the source/drain contact opening CO2 may expose a larger area of the source/drain epitaxial structure 230 than an area of the source/drain epitaxial structure 200 exposed by the source/drain contact opening CO1.

Figure 18:
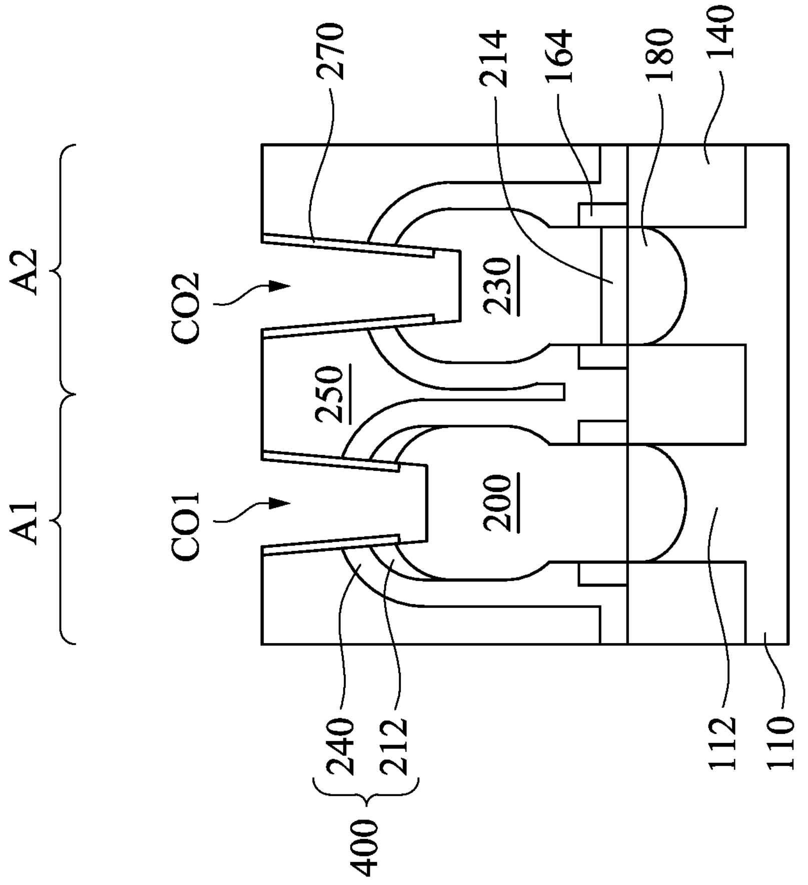

Reference is made to FIG. 18. Dielectric liners 270 are formed in the source/drain contact opening CO2. The dielectric liners 270 may include suitable dielectric material, such as SiN, SiCN, SiCON, SiCO, the like, or the combination thereof. Formation of the dielectric liners 270 may include blanketly depositing a dielectric layer over the structure of FIG. 17, followed by a liner etch process. The liner etch process may etch a bottom portion of the dielectric liners 270 and underlying portions of the source/drain epitaxial structures 200 and 230, thereby deepening the source/drain contact opening CO1 and CO2. Due the depth difference between the source/drain contact opening CO1 and CO2, the dielectric liners 270 in the source/drain contact openings CO1 and CO2 may have bottom ends at different levels. For example, a bottom end of the dielectric liner 270 in the source/drain contact opening CO1 is lower than a end surface of the dielectric liner 270 in the source/drain contact opening CO2 by a vertical distance in a range from about 2 nanometers to about 20 nanometers. If the vertical distance is less than about 2 nanometers or greater than about 20 nanometers, device performance may degrade. In some embodiments, the bottom end of the dielectric liner 270 in the source/drain contact opening CO2 is in contact with the source/drain epitaxial structure 230, and the bottom end of the dielectric liner 270 in the source/drain contact opening CO1 is in contact with regional layer 212 and spaced apart from the source/drain epitaxial structure 200.

Figure 19A:
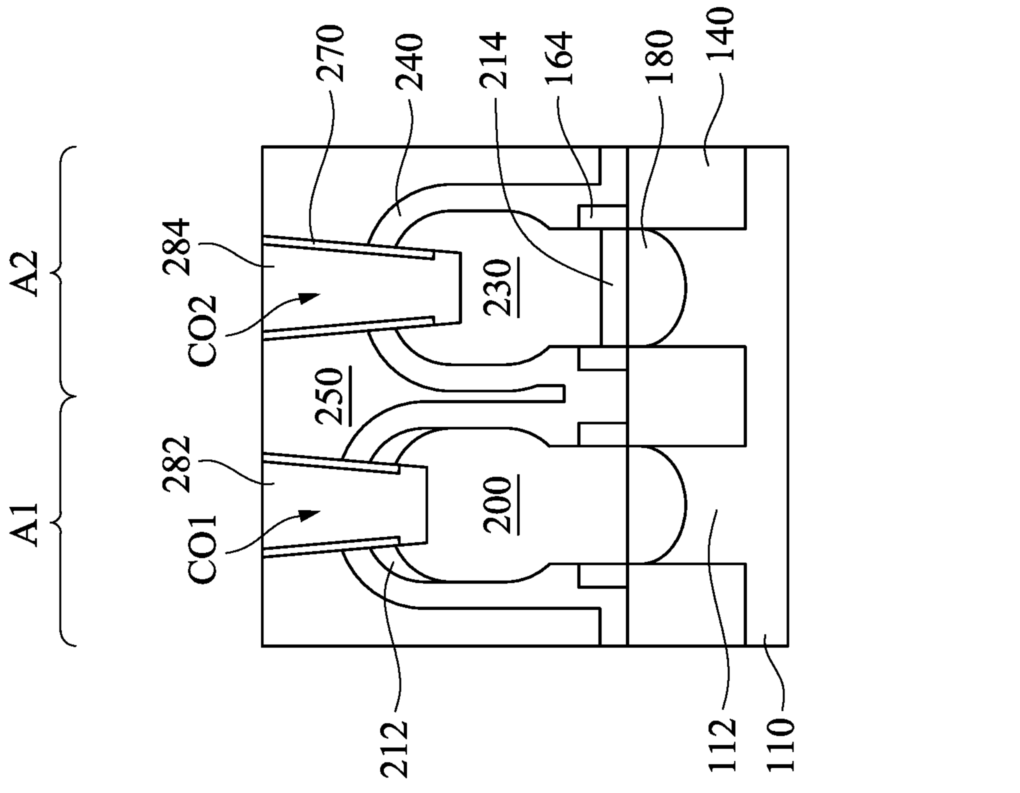
Figure 19B:
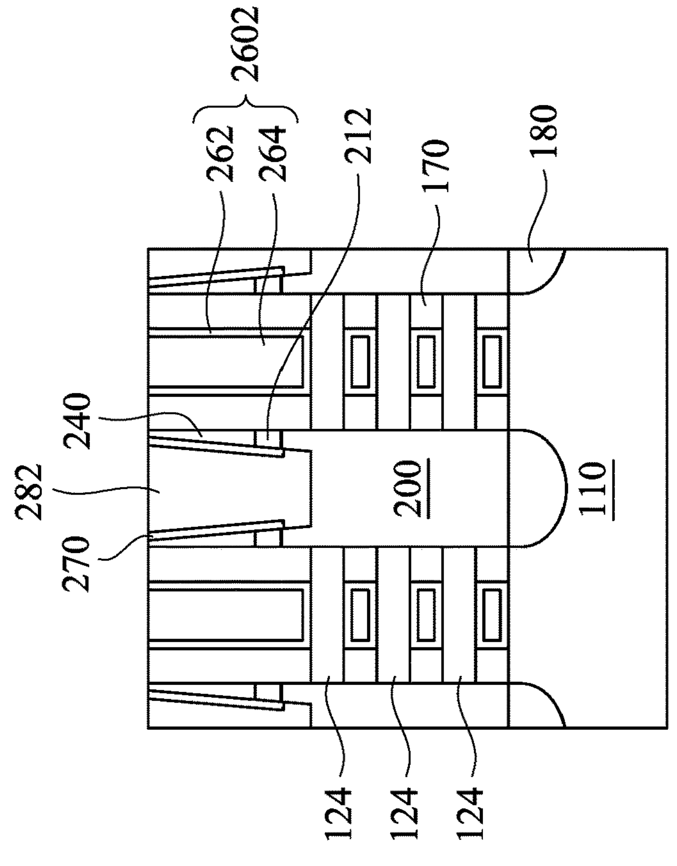
Figure 19C:
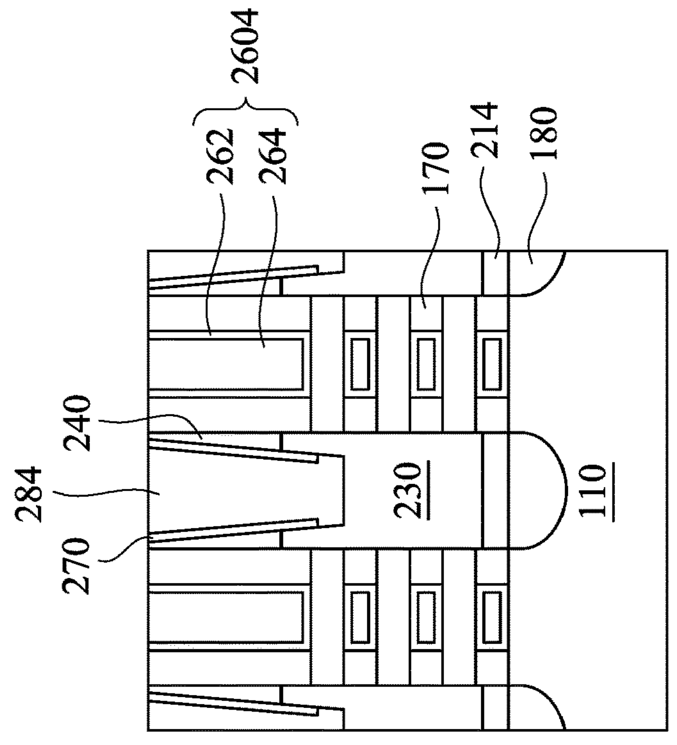

Reference is made to FIGS. 19A-19C. Source/drain contacts 282 and 284 are then formed in the source/drain contact opening CO1 and CO2, respectively. A height of the resulted source/drain contact 284 is greater than a height of the source/drain contact 282. And, the source/drain contact 284 have a greater contact area with the epitaxial structure 230 than a contact area between the source/drain contact 282 and the epitaxial structure 200. Formation of the source/drain contacts 282 and 284 may include depositing conductive materials into the source/drain contact opening CO1 and CO2. The conductive materials may include a barrier layer and a fill metal. The barrier layer may be made of TiN, TaN, or combinations thereof. In some embodiments, the fill metal may be made of metal, such as W, Co, Ru, Al, Cu, or other suitable materials. After the deposition of the conductive materials, a planarization process, such as a chemical mechanical polish (CMP) process, may be then performed.

In some embodiments, the source/drain contacts 282 and 284 includes metal alloy layers in contact with the source/ drain epitaxial structures 200 and 230. Prior to depositing the conductive materials, the metal alloy layers may be respectively formed on portions of the source/drain epitaxial structures 200 and 230 exposed by the source/drain contact opening CO1 and CO2. The metal alloy layers, which may be silicide layers, are respectively formed in the source/drain contact opening CO1 and CO2 and over the exposed surfaces of the source/drain epitaxial structures 200 and 230, by a self-aligned silicide (salicide) process. The silicide process converts the surface portions of the source/drain epitaxial structures 200 and 230 into the silicide contacts. Silicide processing involves deposition of a metal that undergoes a silicidation reaction with silicon (Si). In order to form silicide contacts on the source/drain epitaxial structures 200 and 230, a metal material is blanket deposited on the exposed frontside of the source/drain epitaxial structures 200 and 230. After heating the wafer to a temperature at which the metal reacts with the silicon of the source/drain epitaxial structures 200 and 230 to form contacts, unreacted metal is removed. The silicide contacts remain over the surfaces of the source/drain epitaxial structures 200 and 230, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials.

Figure 20B:
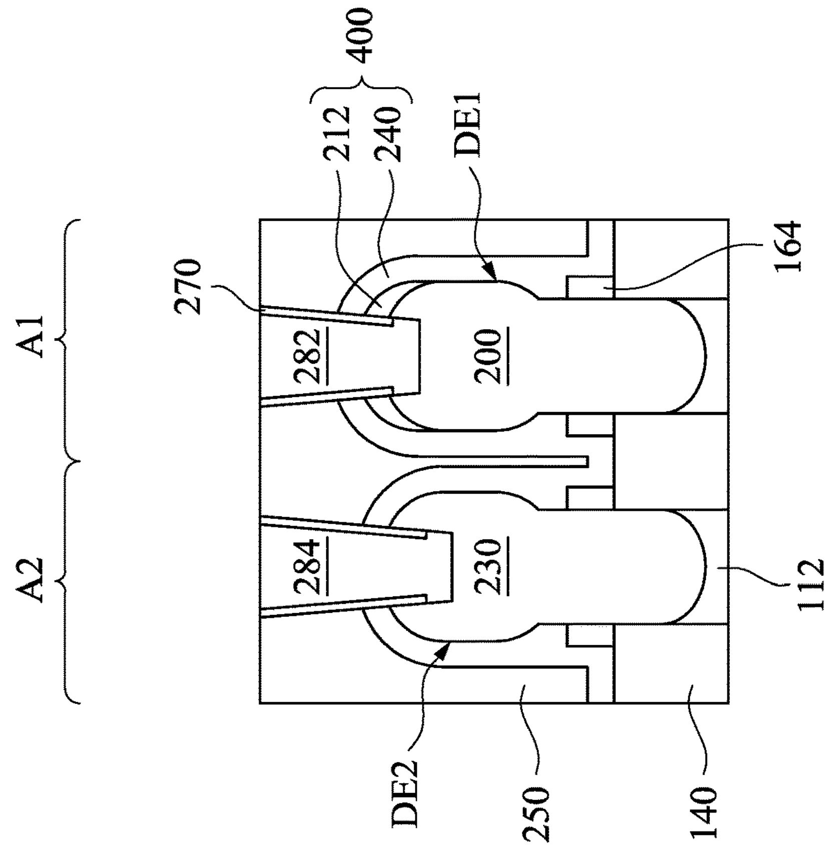
FIGS. 20A and 20B illustrate cross-sectional views of a semiconductor device in accordance with some embodiments of the present disclosure.
Figure 20A:
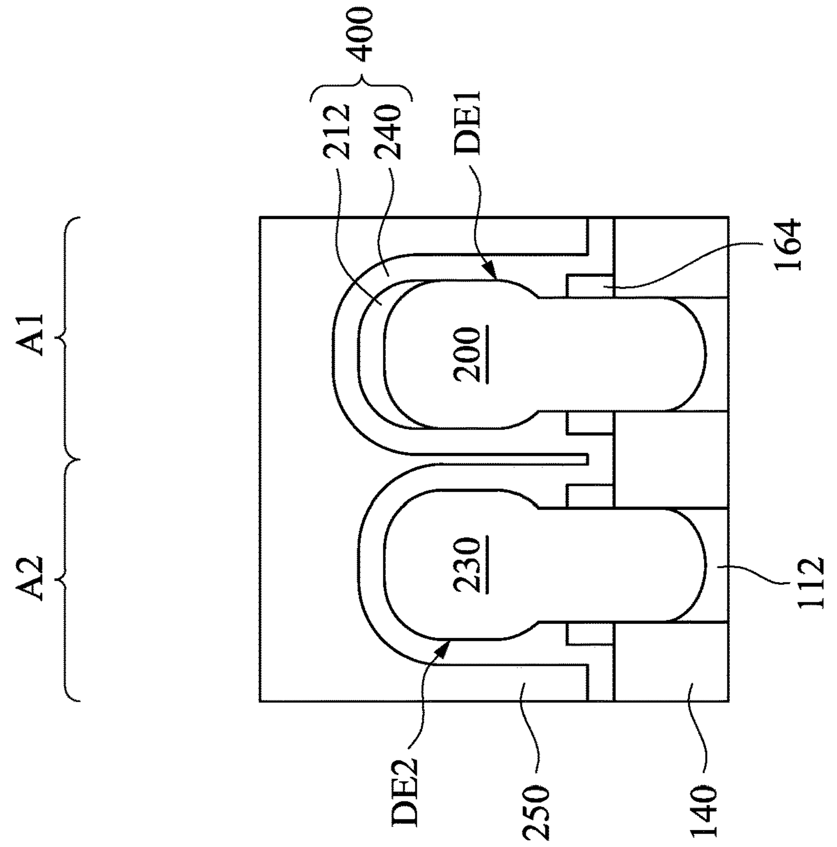

FIGS. 20A and 20B illustrate cross-sectional views of a semiconductor device in accordance with some embodiments of the present disclosure. Details of the present embodiments are similar to that of FIGS. 1A and 1B, except that the isolation layer 214 (referring to FIGS. 1A and 1B) may be omitted, thus the source/drain epitaxial structure 230 is in direct contact with the underlying semiconductor material (e.g., the substrate portion 112). Other details of the present embodiments are similar to those aforementioned, and thereto not repeated herein.

Figure 24:
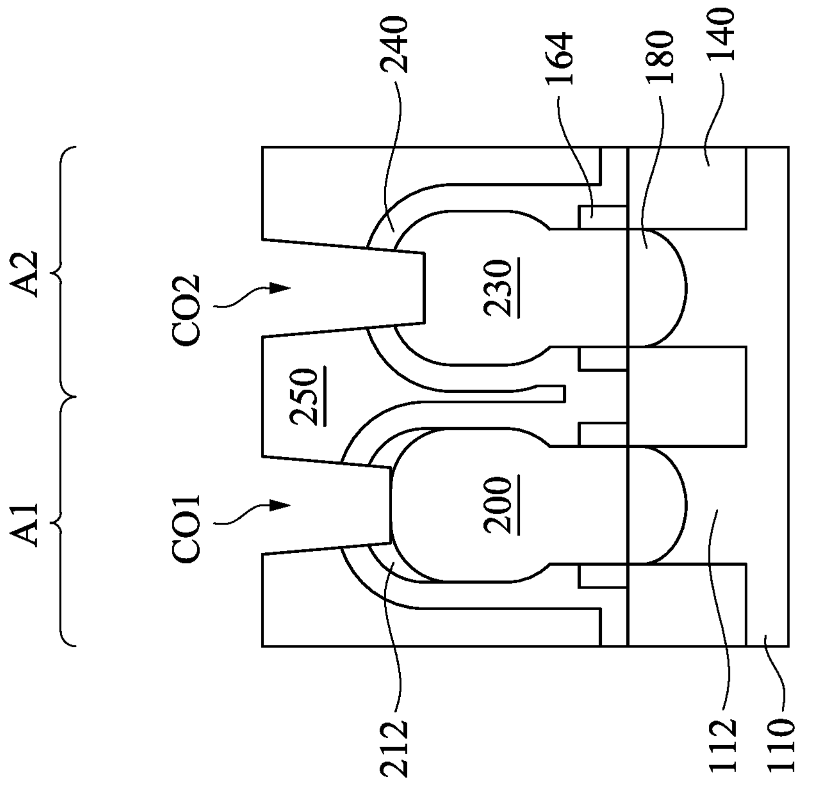
Figure 25:
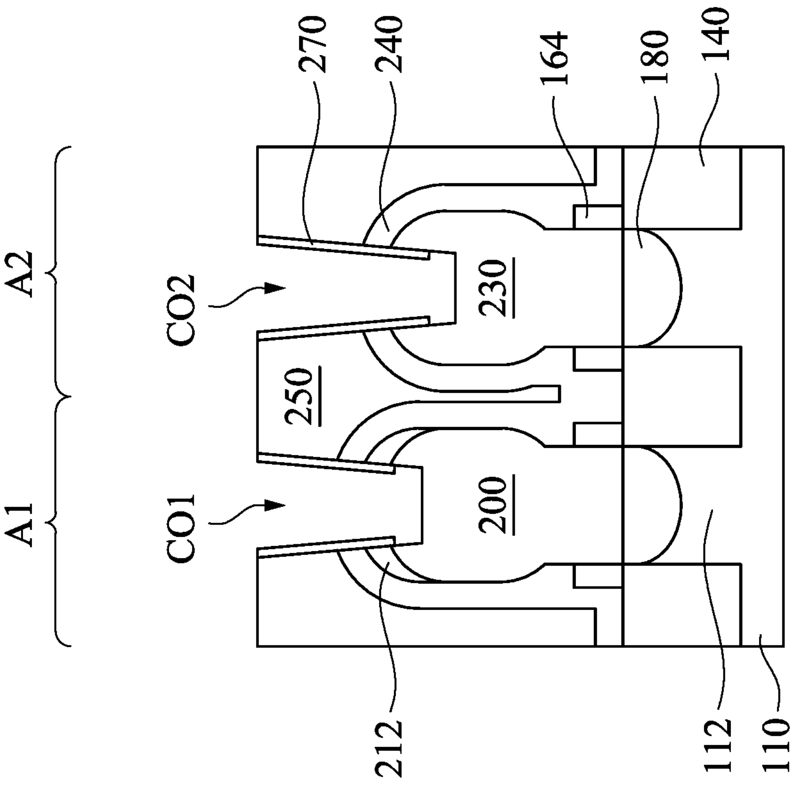
Figure 26A:
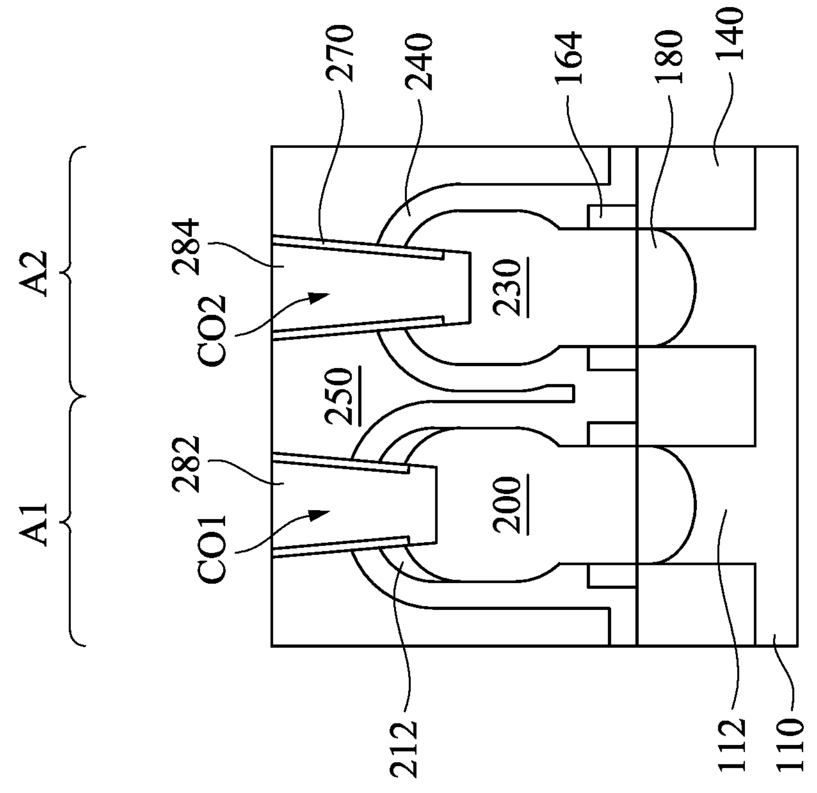
Figure 26C:
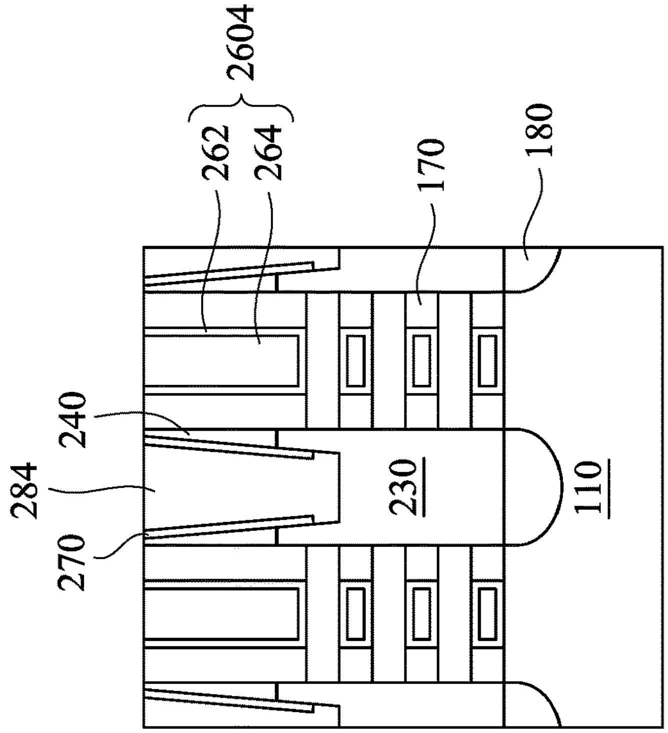

FIGS. 21-26C illustrate top and cross-sectional views of intermediate stages in the manufacture of a semiconductor device in accordance with some embodiments of the present disclosure. FIG. 22A is a top view of the semiconductor device at various manufacturing stages in accordance with some embodiments. FIGS. 21, 22B, 23, 24, 25, and 26A are cross-sectional views of the semiconductor device (e.g., taken along line Y2-Y2 in FIG. 22A) at various manufacturing stages in accordance with some embodiments. FIGS. 22C and 26B are cross-sectional views of the semiconductor device (e.g., taken along line X1-X1 in FIG. 22A) at various manufacturing stages in accordance with some embodiments. FIGS. 22D and 26C are cross-sectional views of the semiconductor device (e.g., taken along line X2-X2 in FIG. 22A) at various manufacturing stages in accordance with some embodiments. The illustrated process in FIGS. 21-26C may be applicable to manufacture the semiconductor device in FIGS. 20A and 20B. It is understood that additional steps may be provided before, during, and after the steps shown in FIGS. 21-26C, and some of the steps described below can be replaced or eliminated for additional embodiments of the method. The order of the operations/processes may be interchangeable.

Figure 21:
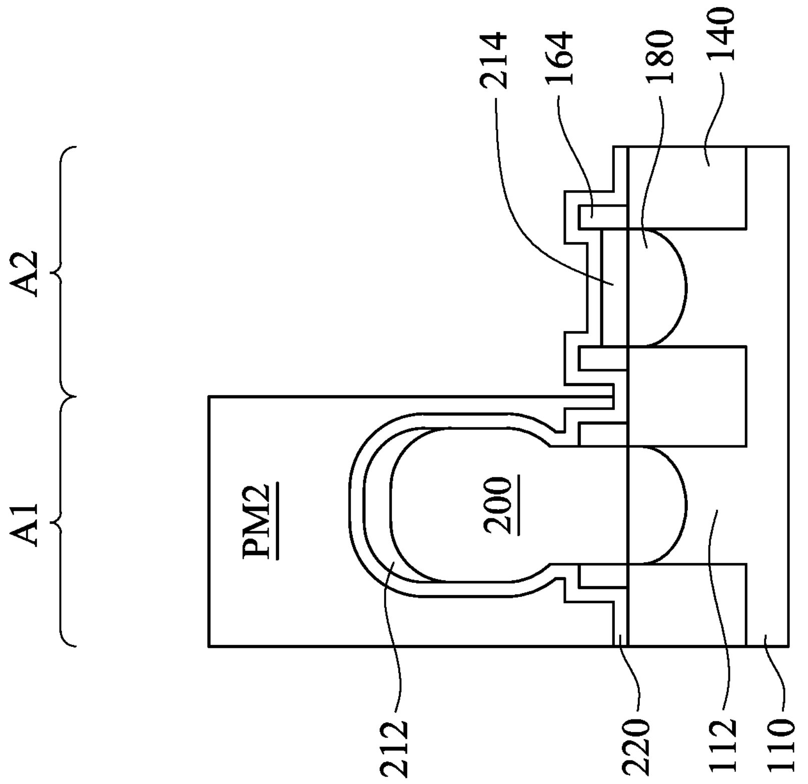
FIGS. 21-26C illustrate top and cross-sectional views of intermediate stages in the manufacture of a semiconductor device in accordance with some embodiments of the present disclosure.
Figure 22B:
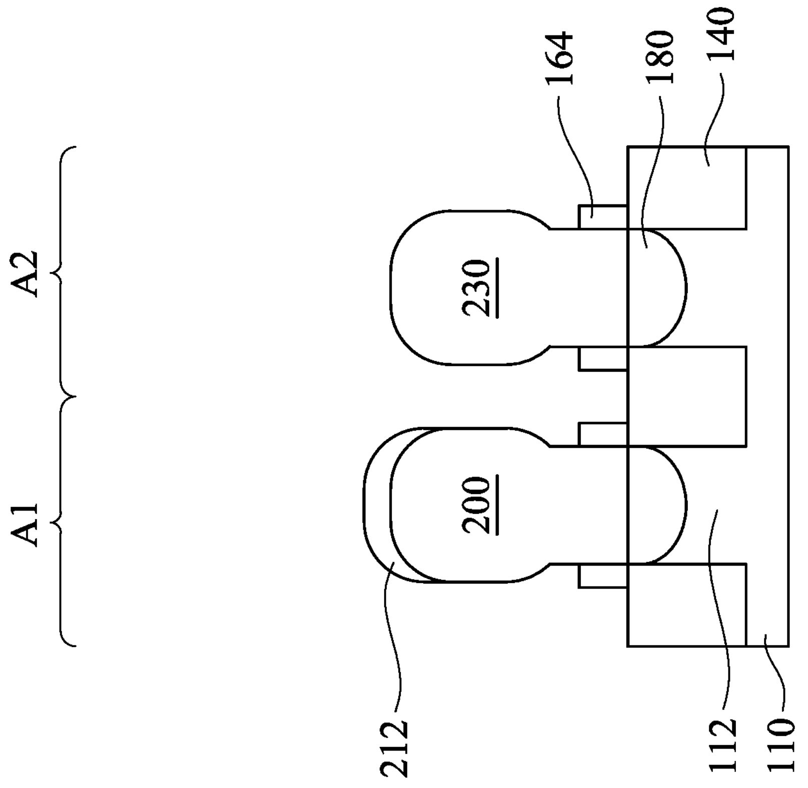
Figure 22C:
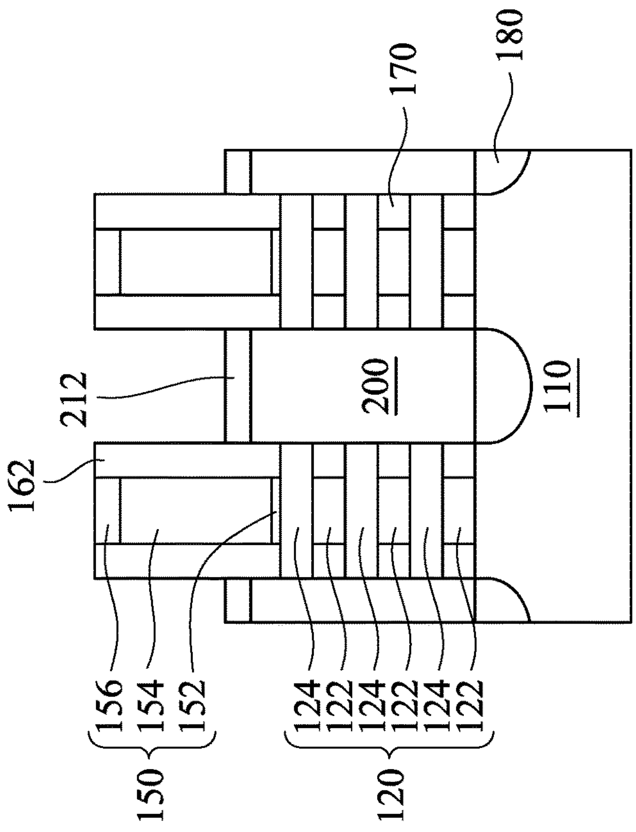
Figure 22D:
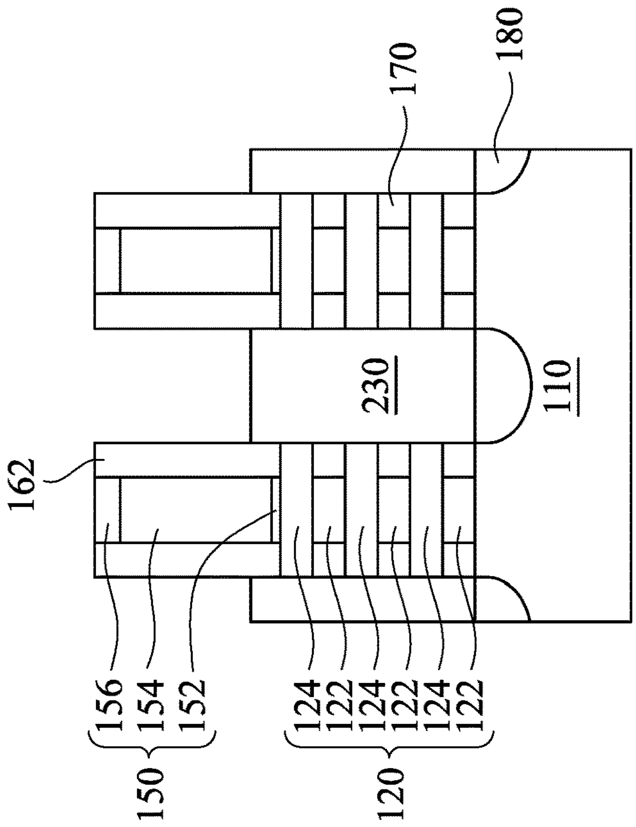

FIG. 21 inherits the structure of FIG. 12. After the formation of the source/drain epitaxial structures 200, the regional layer 212, and the isolation layer 214, a hard mask layer 220 is deposited over the structure of FIG. 11, and a patterned mask PM2 is formed over the hard mask layer 220 to cover the first region A1 (e.g., p-type region).

Reference is made to FIGS. 22A-22D. A portion of the hard mask layer 220 (referring to FIG. 12) over the second region A2 is removed by suitable etching/clean process to expose the isolation layer 214 over the second region A2. Subsequently, the isolation layer 214 is removed by suitable etching/clean process to expose the underlying semiconductor materials (e.g., the epitaxial features 180). Then, source/drain epitaxial structures 230 are formed over the underlying semiconductor materials (e.g., the epitaxial features 180) in the exposed second region A2 (e.g., n-type region). The formation of the source/drain epitaxial structure 230 may be formed by performing an epitaxial growth process that provides an epitaxial material on the epitaxial features 180. During the epitaxial growth process, the gate spacers 162, fin sidewall spacers 164, and the inner spacers 170 limit the source/drain epitaxial structures 200 to the source/drain regions. Suitable epitaxial processes include CVD deposition techniques, molecular beam epitaxy, and/or other suitable processes. The epitaxial growth process may use gaseous and/or liquid precursors, which interact with the composition of semiconductor materials of the epitaxial features 180 and the channel layers 124. After the formation of the source/drain epitaxial structures 230, the patterned mask PM2 (referring to FIG. 21) may be removed by suitable stripping or ashing process. And, a remaining portion of the hard mask layer 220 (referring to FIG. 21) over the first region A1 is removed by suitable etching/clean process.

Figure 23:
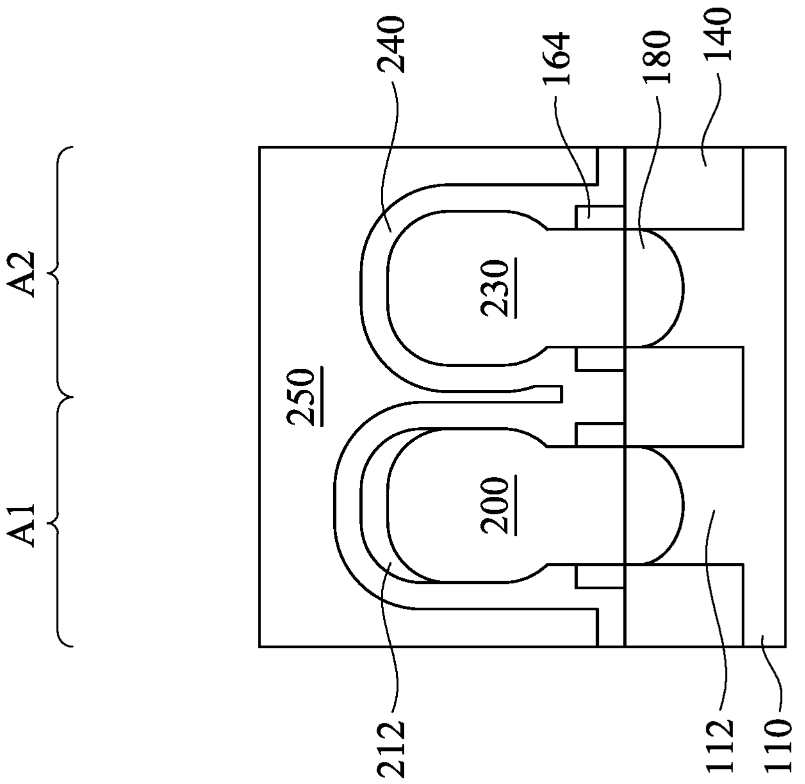

Reference is made to FIG. 23. A dielectric layer 240 is conformally deposited over the structure of FIG. 22B. The dielectric layer 240 may include $SiO_2$, SiN, SiCN, SiCON, SiCO, AlO, HfO, other high k dielectric material, the like, or the combination thereof. The dielectric layer 240 may be a single film or a multi-layered film. In some embodiments, the dielectric layer 240 may be referred to as CESL. In some embodiments, a combination of the dielectric layer 240 and the regional layer 212 are referred to as CESL 400. An interlayer dielectric (ILD) layer 250 is formed over the CESL 400 and filling the space between the dummy gate structures 150.

Reference is made to FIG. 24. One or more etching processes is performed to form source/drain contact openings CO1 and CO2 by removing portions the ILD layer 250 and the CESL 400. Due to the thickness different between the CESL 400 over the source/drain epitaxial structures 200 and 230, and the etch selectivity between the CESL and the epitaxial materials in the source/drain epitaxial structures 200 and 230, the source/drain contact opening CO2 is deeper than the source/drain contact opening CO1.

Reference is made to FIG. 25. Dielectric liners 270 are formed in the source/drain contact opening CO2. Formation of the dielectric liners 270 may include blanketly depositing a dielectric layer over the structure of FIG. 17, followed by a liner removal process. The liner removal process may etch a bottom portion of the dielectric liners 270 and underlying portions of the source/drain epitaxial structures 200 and 230, thereby deepening the source/drain contact opening CO1 and CO2.

Figure 26B:
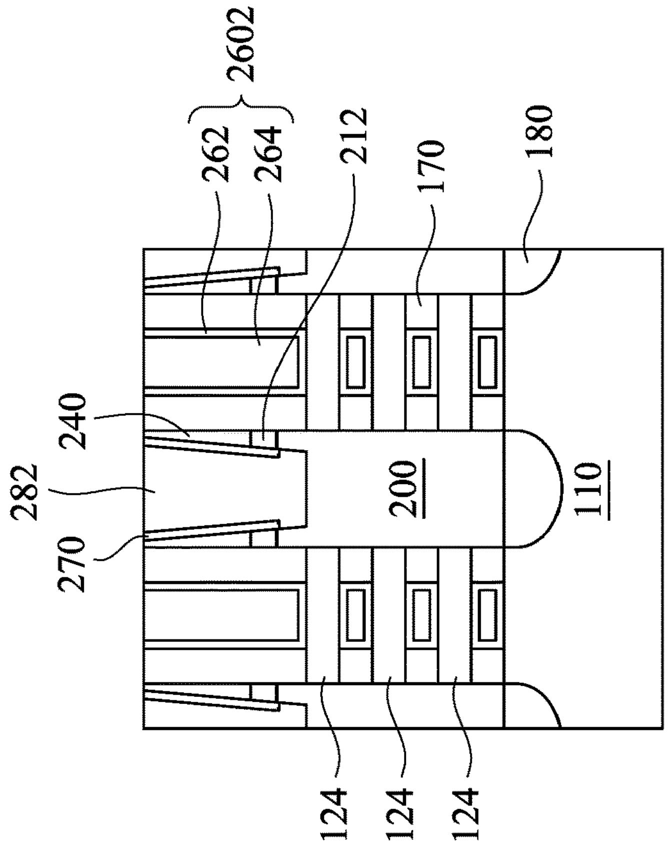

Reference is made to FIGS. 26A-26C. Source/drain contacts 282 and 284 are then formed in the source/drain contact opening CO1 and CO2, respectively. Formation of the source/drain contacts 282 and 284 may include depositing conductive materials into the source/drain contact opening CO1 and CO2. The conductive materials may include a barrier layer and a fill metal. In some embodiments, the source/drain contacts 282 and 284 includes metal alloy layers in contact with the source/drain epitaxial structures 200 and 230. Prior to depositing the conductive materials, the metal alloy layers may be respectively formed on portions of the source/drain epitaxial structures 200 and 230 exposed by the source/drain contact opening CO1 and CO2. After the deposition of the conductive materials, a planarization process, such as a chemical mechanical polish (CMP) process, may be then performed. Other details of the present embodiments are similar to those aforementioned, and thereto not repeated herein.

Figure 27:
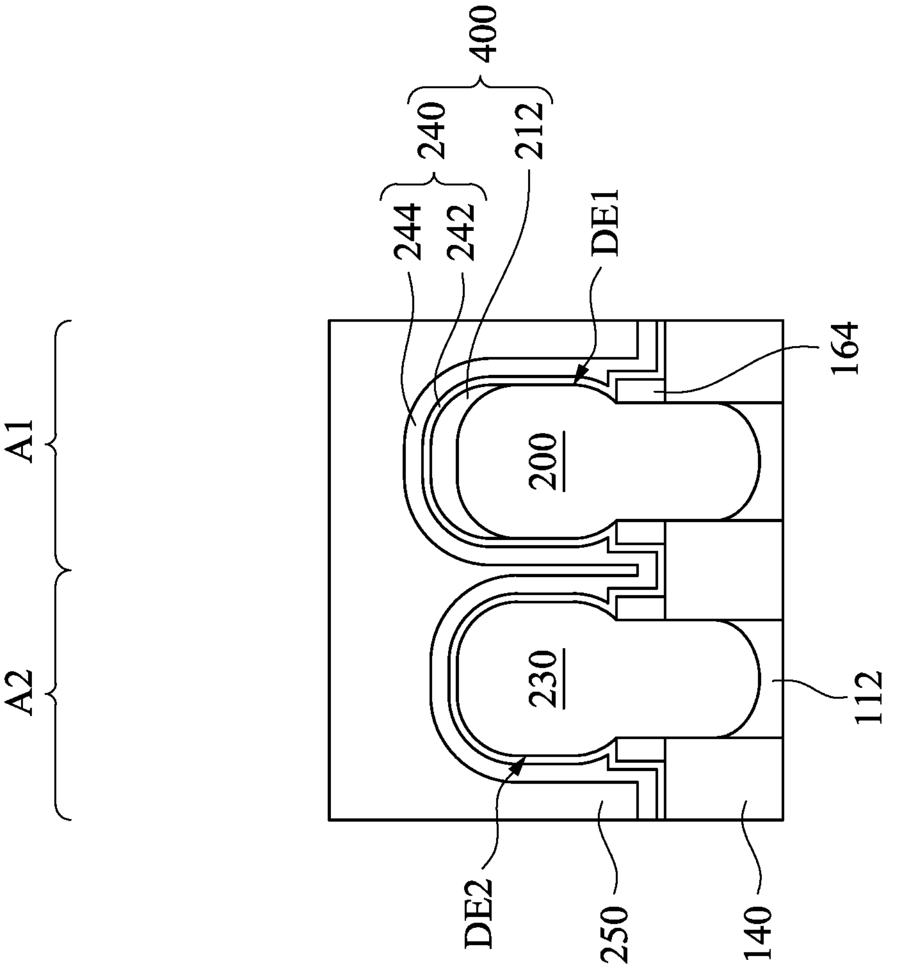
FIG. 27 illustrates a cross-sectional view of a semiconductor device in accordance with some embodiments of the present disclosure.

FIG. 27 illustrates a cross-sectional view of a semiconductor device in accordance with some embodiments of the present disclosure. Details of the present embodiments are similar to that of FIGS. 1A and 1B, except that the dielectric layer 240 is a multi-layered film. For example, the dielectric layer 240 includes a first dielectric layer 242 conformally deposited over the regional layer 212 and the source/drain epitaxial structures 200 and 230, and a second dielectric layer 244 conformally deposited over the first dielectric layer 242. The first and second dielectric layer 242 and 244 may include $SiO_2$, SiN, SiCN, SiCON, SiCO, AlO, HfO, other high k dielectric material, the like, or the combination thereof. The first and second dielectric layer 242 and 244 may include different materials. For example, the first dielectric layer 242 includes SiCON, and the second dielectric layer 242 include SiN. In some embodiments, the second dielectric layer 244 may include the same material as that of the dielectric layer 212, such as SiN. In some other embodiments, the second dielectric layer 244 and the dielectric layer 212 may include different materials. An ILD layer 250 is formed over the CESL 400. Source/drain contacts 282 and 284 (referring to FIG. 1B) may be formed in ILD 250 and the CESL 400 and in contact with the source/drain epitaxial structures 200 and 230. In some embodiments, the configuration of the isolation layer 214 (referring to FIGS. 1A and 1B) is optional, and can be omitted. Other details of the present embodiments are similar to those aforementioned, and thereto not repeated herein.

Figure 28:
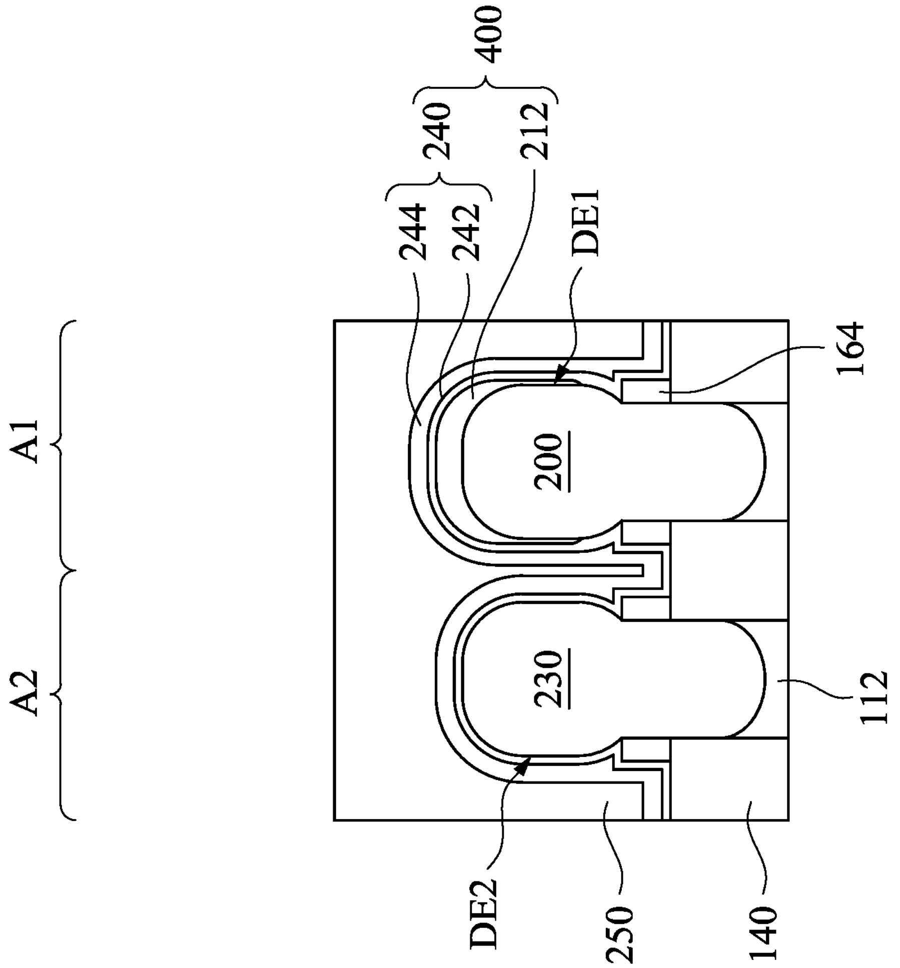
FIG. 28 illustrates a cross-sectional view of a semiconductor device in accordance with some embodiments of the present disclosure.

FIG. 28 illustrates a cross-sectional view of a semiconductor device in accordance with some embodiments of the present disclosure. Details of the present embodiments are similar to that of FIG. 27, except that the regional layer 212 further covers upper portions of lateral sidewalls of the source/drain epitaxial structure 200. The regional layer 212 is formed by patterning a dielectric layer (e.g., the dielectric film 210 in FIG. 10), in which the patterning process includes an implantation process (e.g., the implantation process P1 in FIG. 10) followed by an etching process. Unlike the implantation process P1 performed substantially along a direction normal to the substrate 110 as illustrated in FIG. 10, in the present embodiments, the implantation process may be performed at an oblique angle with respect to the directional normal to the substrate 110, resulting portions of the dielectric layer (e.g., the dielectric film 210 in FIG. 10) at top and lateral sidewalls of the source/drain epitaxial structure 200 being doped. The etching process may remove undoped portions of the dielectric layer (e.g., the dielectric film 210 in FIG. 10), and not substantially remove the doped portions of the dielectric layer (e.g., the dielectric film 210 in FIG. 10). In the present embodiments, after the etching process, the doped portion of the dielectric layer (e.g., the dielectric film 210 in FIG. 10) form the regional layer 212 surrounding the source/drain epitaxial structure 200 and an isolation layer 214 (referring to FIGS. 1A and 1B) over the region A2. Lower portions of the lateral sidewalls of the source/drain epitaxial structure 200 may be free from coverage of the regional layer 212. As aforementioned, the configuration of the isolation layer 214 (referring to FIGS. 1A and 1B) is optional, and can be removed by suitable etching process. A source/drain epitaxial structure 230 is formed over the region A2. The multi-layered dielectric layer 240 is formed over the source/drain epitaxial structures 200 and 230. The multi-layered dielectric layer 240 and the regional layer 212 in combination are referred to as the CESL 400. An ILD layer 250 is formed over the CESL 400. Source/drain contacts 282 and 284 (referring to FIG. 1B) may be formed in ILD 250 and the CESL 400 and in contact with the source/drain epitaxial structures 200 and 230. In some embodiments, the configuration of the isolation layer 214 (referring to FIGS. 1A and 1B) is optional, and can be omitted. Other details of the present embodiments are similar to those aforementioned, and thereto not repeated herein.

Figure 29:
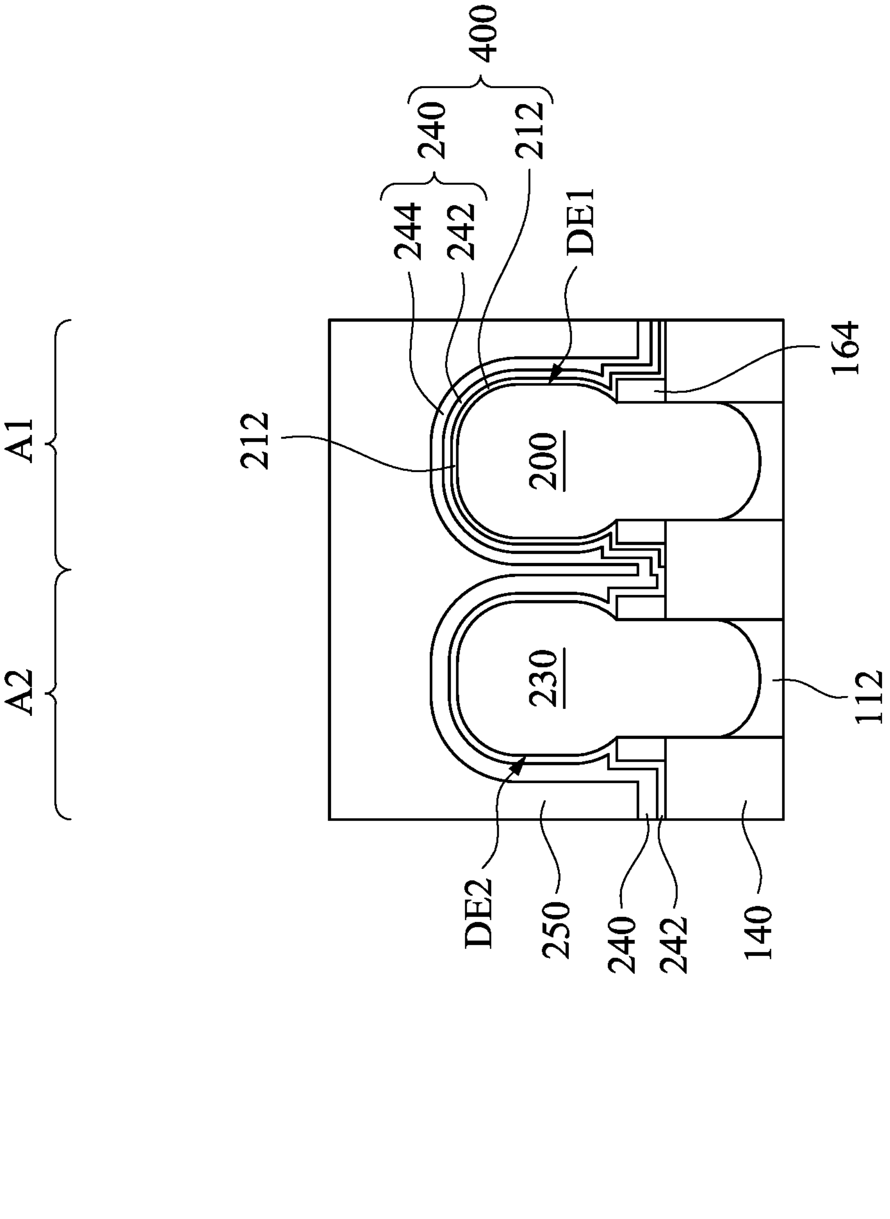
FIG. 29 illustrates a cross-sectional view of a semiconductor device in accordance with some embodiments of the present disclosure.

FIG. 29 illustrates a cross-sectional view of a semiconductor device in accordance with some embodiments of the present disclosure. Details of the present embodiments are similar to that of FIGS. 27, except that the regional layer 212 covers the top and lateral sidewalls (including upper and lower portions thereof) of the source/drain epitaxial structure 200 and the isolation structure 140 in the region A1. The regional layer 212 is formed by patterning a dielectric layer (e.g., the dielectric film 210 in FIG. 10), in which the patterning process includes an etching process. The implantation process P1 in FIG. 10 is omitted. A hard mask layer 220 (referring to FIG. 12) is deposited over the dielectric layer (e.g., the dielectric film 210 in FIG. 10), and a patterned mask PM2 (referring to FIG. 12) is formed over the hard mask layer 220. A patterned mask PM2 (referring to FIG. 12) may be formed to cover the first region A1 (e.g., p-type region). A portion of the hard mask layer 220 (referring to FIG. 12) and the dielectric layer (e.g., the dielectric film 210 in FIG. 10) over the second region A2 exposed by the patterned mask PM2 (referring to FIG. 12) are removed by suitable etching/clean process to expose the second region A2. Then, source/drain epitaxial structures 230 are formed over the second region A2 (e.g., n-type region). The multi-layered dielectric layer 240 and the regional layer 212 in combination are referred to as the CESL 400. An ILD layer 250 is formed over the CESL 400. Source/drain contacts 282 and 284 (referring to FIG. 1B) may be formed in ILD 250 and the CESL 400 and in contact with the source/drain epitaxial structures 200 and 230. In some embodiments, the configuration of the isolation layer 214 (referring to FIGS. 1A and 1B) is optional, and can be omitted. Other details of the present embodiments are similar to those aforementioned, and thereto not repeated herein.

Figure 30:
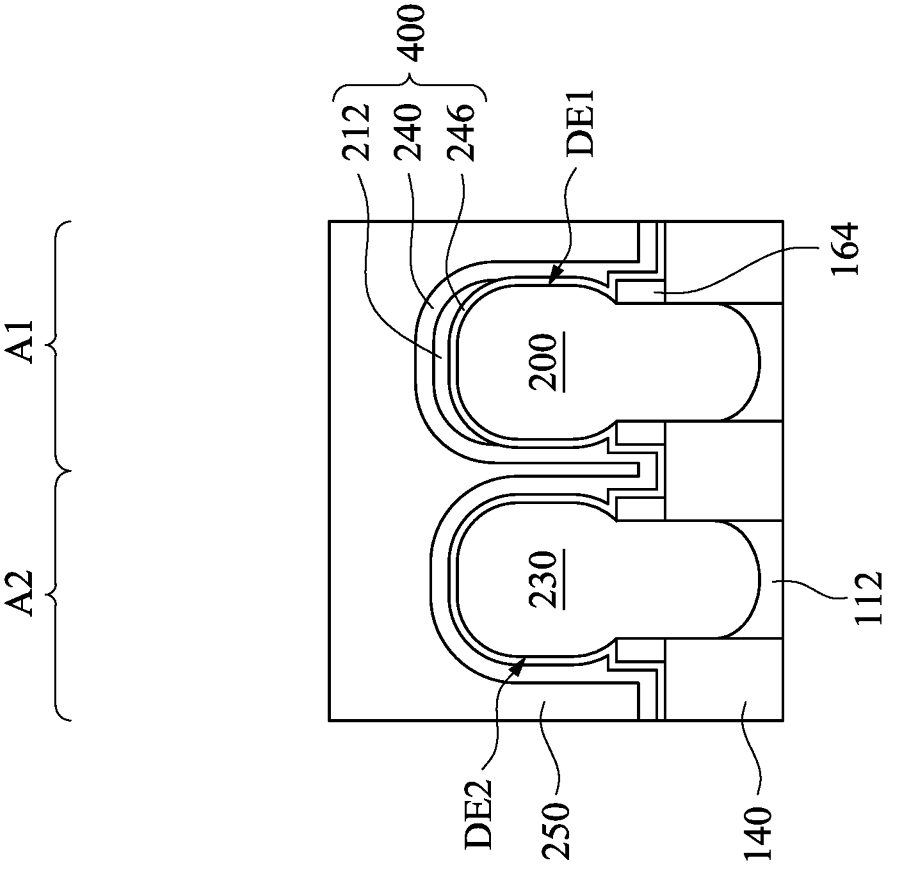
FIG. 30 illustrates a cross-sectional view of a semiconductor device in accordance with some embodiments of the present disclosure.

FIG. 30 illustrates a cross-sectional view of a semiconductor device in accordance with some embodiments of the present disclosure. Details of the present embodiments is similar to that of FIG. 27, except that the regional layer 212 is formed between two dielectric layers 246 and 240 of the CESL 400. Formation of the CESL 400 may include conformally depositing a dielectric layer 246 over the source/drain epitaxial structures 200 and 230, conformally depositing a dielectric material layer of the regional layer 212 over the dielectric layer 246, patterning the dielectric layer into the regional layer 212, and conformally depositing a dielectric layer 240. The dielectric layer 246 may include a dielectric material different from that of the regional layer 212. The dielectric layer 246 may include $SiO_2$, SiN, SiCN, SiCON, SiCO, AlO, HfO, other high k dielectric material, the like, or the combination thereof. The patterning process to form the regional layer 212 may include forming a patterned mask by a suitable lithography process, followed by an etching process. After the formation of the patterned mask and the etching process, in some embodiments, the patterning process to form the regional layer 212 may further include an implantation process (e.g., the implantation process P1 in FIG. 10) followed by another etching process, in which the implantation process may be performed substantially along a direction normal to the substrate 110 as illustrated in FIG. 10. Other details of the present embodiments are similar to those aforementioned, and thereto not repeated herein.

Figure 31:
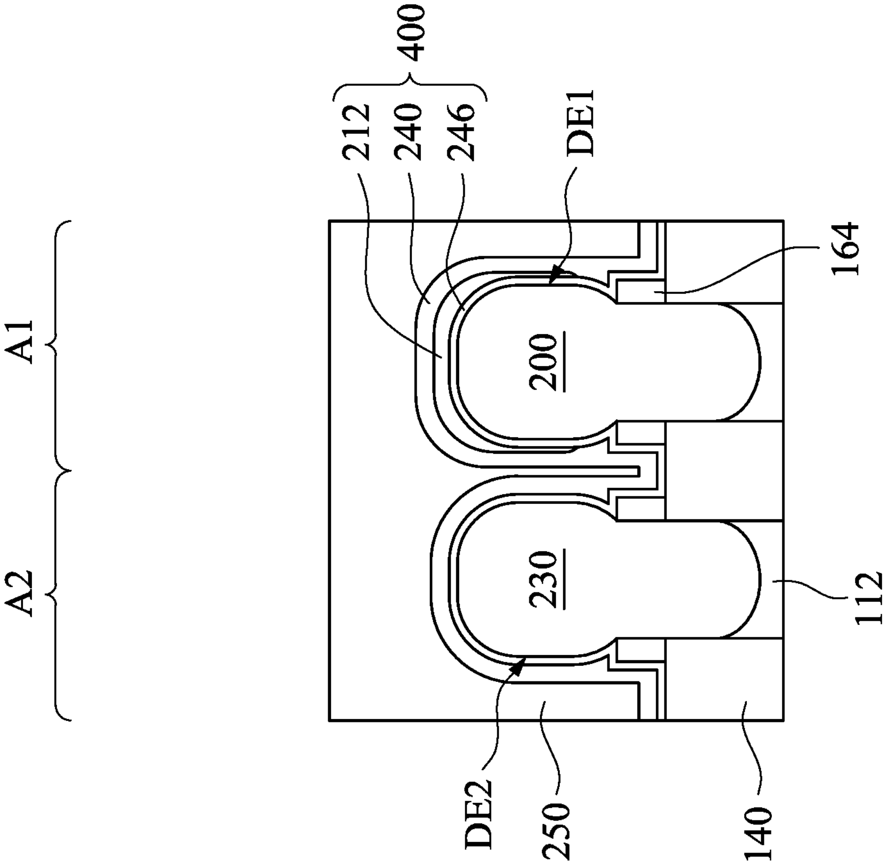
FIG. 31 illustrates a cross-sectional view of a semiconductor device in accordance with some embodiments of the present disclosure.

FIG. 31 illustrates a cross-sectional view of a semiconductor device in accordance with some embodiments of the present disclosure. Details of the present embodiments is similar to that of FIG. 30, except that the regional layer 212 further covers upper portions of the lateral sidewalls of the source/drain epitaxial structure 200. The regional layer 212 is formed by patterning a dielectric layer. The patterning process to form the regional layer 212 may include forming a patterned mask by a suitable lithography process, followed by an etching process. After the formation of the patterned mask and the etching process, in some embodiments, the patterning process to form the regional layer 212 may include an implantation process (e.g., the implantation process P1 in FIG. 10) followed by another etching process. Unlike the implantation process P1 performed substantially along a direction normal to the substrate 110 as illustrated in FIG. 10, in the present embodiments, the implantation process may be performed at an oblique angle with respect to the directional normal to the substrate 110, resulting portions of the dielectric layer at top and lateral sidewalls of the source/drain epitaxial structure 200 being doped. The etching process may remove undoped portions of the dielectric layer, and not substantially remove the doped portions of the dielectric layer. In the present embodiments, after the etching process, the doped portion of the dielectric layer forms the regional layer 212. Lower portions of the lateral sidewalls of the source/drain epitaxial structure 200 may be free from coverage of the regional layer 212. Other details of the present embodiments are similar to those aforementioned, and thereto not repeated herein.

Figure 32:
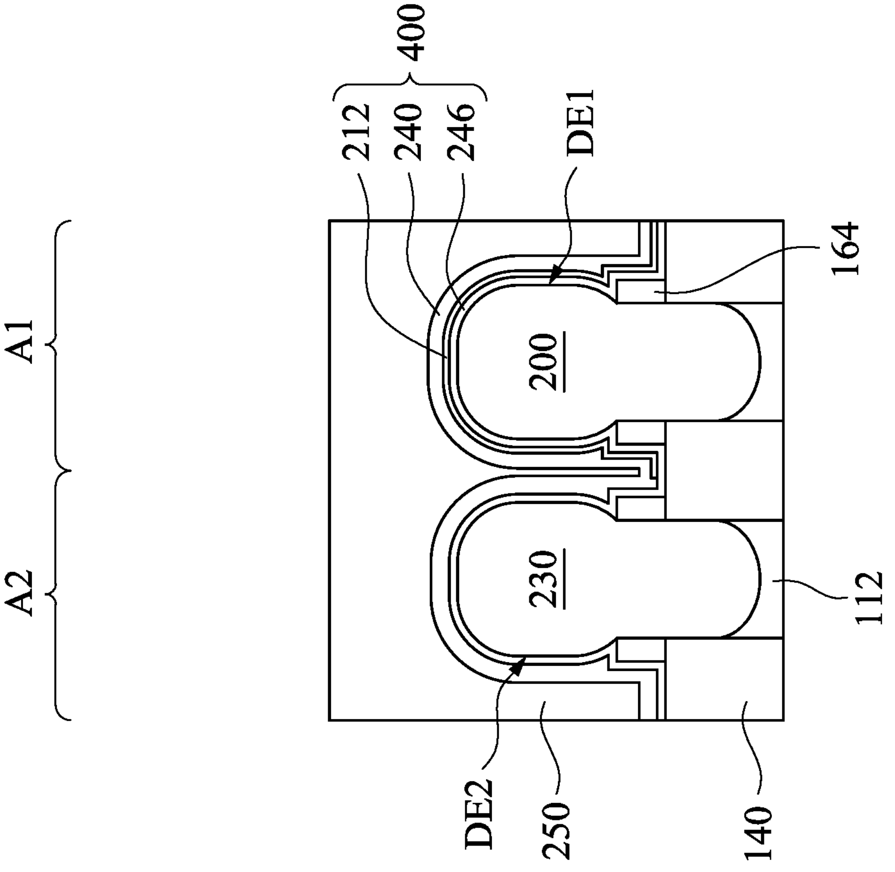
FIG. 32 illustrates a cross-sectional view of a semiconductor device in accordance with some embodiments of the present disclosure.

FIG. 32 illustrates a cross-sectional view of a semiconductor device in accordance with some embodiments of the present disclosure. Details of the present embodiments are similar to that of FIG. 30, except that the regional layer 212 covers the top and lateral sidewalls (including upper and lower portions thereof) of the source/drain epitaxial structure 200 and the isolation structure 140 in the region A1. Formation of the CESL 400 may include conformally depositing a dielectric layer 246 over the source/drain epitaxial structures 200 and 230, conformally depositing a dielectric material layer of the regional layer 212 over the dielectric layer 246, patterning the dielectric layer into the regional layer 212, and conformally depositing a dielectric layer 400. The patterning process to form the regional layer 212 may include forming a patterned mask by a suitable lithography process, followed by an etching process. Other details of the present embodiments are similar to those aforementioned, and thereto not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by using different CESL thickness, profile, material composite, or layer numbers on NEPI and PEP, the recess amount of the source/drain contact opening can be modulated for device optimization. PMOS has shallower source/drain contact on p-type source/drain epitaxial structure for channel stress (and lower channel resistance), and NMOS has deeper source/drain contact on n-type source/drain epitaxial structure for contact area (and lower parasitic resistance). The contact area between the source/drain contact and the n-type source/drain epitaxial structure is enlarged, thereby lowering the parasitic resistance. Another advantage is that no additional mask is needed. Still another advantage is that the process for adjust the thickness of CESL and be combined with the formation of the NEPI bottom isolation dielectric.

According to some embodiments of the present disclosure, a semiconductor device includes a first channel region, a second channel region, a gate structure, a first source/drain epitaxial structure, a second source/drain epitaxial structure, a contact etch stop layer, and an interlayer dielectric layer. The gate structure is across the first channel region and the second channel region. The first source/drain epitaxial structure is on a side of the first channel region. The second source/drain epitaxial structure is on a side of the second channel region. The contact etch stop layer surrounds the first source/drain epitaxial structure and the second source/drain epitaxial structure. A first portion of the contact etch stop layer over the first source/drain epitaxial structure is thicker than a second portion of the contact etch stop layer over the second source/drain epitaxial structure. The interlayer dielectric layer is over the contact etch stop layer.

According to some embodiments of the present disclosure, a semiconductor device includes a channel region, a gate structure, a source/drain epitaxial structure, a contact etch stop layer. The gate structure is across the channel region. The source/drain epitaxial structure is on a side of the channel region. The contact etch stop layer surrounds the source/drain epitaxial structure. The contact etch stop layer comprises a first dielectric layer and a second dielectric layer. The first dielectric layer is at a top of the source/drain epitaxial structure. At least a lower portion of a sidewall of the source/drain epitaxial structure is free of the first dielectric layer. The second dielectric layer at the top and the sidewall of the source/drain epitaxial structure and over the first dielectric layer. An interlayer dielectric layer over the contact etch stop layer.

According to some embodiments of the present disclosure, a method for manufacturing a semiconductor device includes forming a gate structure across a first channel region and a second channel region; epitaxially growing a first source/drain epitaxial structure on a side of the first channel region; depositing a dielectric film; patterning the dielectric film into at least a first contact etch stop layer over the first source/drain epitaxial structure; after patterning the dielectric film into the first contact etch stop layer, epitaxially growing a second source/drain epitaxial structure on a side of the second channel region; depositing a second contact etch stop layer over the first contact etch stop layer and the second source/drain epitaxial structure; depositing an interlayer dielectric layer over the second contact etch stop layer; and forming a first source/drain contact and a second source/drain contact in the interlayer dielectric layer and respectively over the first source/drain epitaxial structure and the second source/drain epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a gate structure across a first channel region and a second channel region;

epitaxially growing a first source/drain epitaxial structure on a side of the first channel region;

depositing a dielectric film;

patterning the dielectric film into at least a first contact etch stop layer over the first source/drain epitaxial structure;

after patterning the dielectric film into the first contact etch stop layer, epitaxially growing a second source/drain epitaxial structure on a side of the second channel region;

depositing a second contact etch stop layer over the first contact etch stop layer and the second source/drain epitaxial structure;

depositing an interlayer dielectric layer over the second contact etch stop layer; and forming a first source/drain contact and a second source/drain contact in the interlayer dielectric layer and respectively over the first source/drain epitaxial structure and the second source/drain epitaxial structure.

2. The method of claim 1, wherein forming the first source/drain contact and the second source/drain contact comprises:

etching a first source/drain opening in the interlayer dielectric layer and the first and second contact etch stop layers and a second source/drain opening in the interlayer dielectric layer and the second contact etch stop layer; and depositing a conductive material into the first and second source/drain openings.

3. The method of claim 1, wherein patterning the dielectric film is performed such that the first contact etch stop layer covers an upper portion of a sidewall of the first source/drain epitaxial structure.

4. The method of claim 1, wherein patterning the dielectric film is performed such that a sidewall of the first source/drain epitaxial structure is free from coverage of the first contact etch stop layer.

5. The method of claim 1, wherein patterning the dielectric film comprises patterning the dielectric film into the first contact etch stop layer and an isolation layer, and epitaxially growing the second source/drain epitaxial structure is performed such that the second source/drain epitaxial structure is over the isolation layer.

6. A method for manufacturing a semiconductor device, comprising:

forming a gate structure across a first channel region and a second channel region;

forming a first source/drain epitaxial structure on a side of the first channel region;

forming a second source/drain epitaxial structure on a side of the second channel region;

forming a contact etch stop layer surrounding the first source/drain epitaxial structure and the second source/drain epitaxial structure, wherein a first portion of the contact etch stop layer over the first source/drain epitaxial structure is thicker than a second portion of the contact etch stop layer over the second source/drain epitaxial structure;

forming an interlayer dielectric layer over the contact etch stop layer; and forming an isolation layer on the side of the second channel region, wherein the isolation layer is below the second source/drain epitaxial structure, and the isolation layer comprises a dielectric material the same as a layer of the contact etch stop layer.

7. The method of claim 6, wherein the first source/drain epitaxial structure and the second source/drain epitaxial structure are of opposite conductive types.

8. The method of claim 6, further comprising:

forming a first source/drain contact over the first source/drain epitaxial structure; and forming a second source/drain contact over the second source/drain epitaxial structure, wherein a height of the second source/drain contact is greater than a height of the first source/drain contact.

9. The method of claim 8, further comprising:

forming a first dielectric liner between the first source/drain contact and the interlayer dielectric layer; and forming a second dielectric liner between the second source/drain contact and the interlayer dielectric layer, wherein a bottom end of the first dielectric liner is higher than a bottom end of the second dielectric liner.

10. The method of claim 6, wherein the contact etch stop layer comprises a plurality of dielectric layers, and a number of the dielectric layers in the first portion of the contact etch stop layer is greater than a number of the dielectric layers in the second portion of the contact etch stop layer.

11. The method of claim 6, wherein at least two of the dielectric layers comprises different dielectric materials.

12. The method of claim 6, wherein a third portion of the contact etch stop layer at a sidewall of the first source/drain epitaxial structure is thinner than the first portion of the contact etch stop layer over the first source/drain epitaxial structure.

13. A method for manufacturing a semiconductor device, comprising:

forming a gate structure across a channel region;

forming a source/drain epitaxial structure on a side of the channel region;

forming a contact etch stop layer surrounding the source/drain epitaxial structure, comprising:

forming a first dielectric layer at a top of the source/drain epitaxial structure, wherein at least a lower portion of a sidewall of the source/drain epitaxial structure is free of the first dielectric layer; and forming a second dielectric layer at the top and the sidewall of the source/drain epitaxial structure and over the first dielectric layer;

forming an interlayer dielectric layer over the contact etch stop layer; and forming a third dielectric layer at the top and the sidewall of the source/drain epitaxial structure and below the first dielectric layer, wherein the third dielectric layer comprises a dielectric material different from that of the first dielectric layer.

14. The method of claim 13, wherein an oxygen concentration of the second dielectric layer is greater than that of the first dielectric layer.

15. The method of claim 13, wherein the first dielectric layer is further at an upper portion of the sidewall of the source/drain epitaxial structure.

16. The method of claim 13, wherein an upper portion of the sidewall of the source/drain epitaxial structure is free of the first dielectric layer.

17. The method of claim 13, further comprising:

forming a source/drain contact over the source/drain epitaxial structure; and forming a dielectric liner between the source/drain contact and the interlayer dielectric layer, wherein a bottom end of the dielectric liner is in contact with the first dielectric layer.

18. The method of claim 13, wherein the source/drain epitaxial structure is an p-type feature.

19. The method of claim 6, wherein forming the contact etch stop layer comprises depositing a dielectric film and patterning the dielectric film, and wherein patterning the dielectric film comprises performing an implantation process using a nitrogen plasma into the dielectric film.

20. The method of claim 13, wherein the first dielectric layer comprises silicon nitride, and the second dielectric layer comprises silicon carbon oxynitride and silicon nitride.

* * * * *